(12) United States Patent
Cheng et al.

(10) Patent No.: US 12,051,622 B2
(45) Date of Patent: Jul. 30, 2024

(54) PASSIVATION LAYER AND PLANARIZATION LAYER AND METHOD OF FORMING THE SAME

(71) Applicant: Taiwan Semiconductor Manufacturing Co., Ltd., Hsinchu (TW)

(72) Inventors: Ming-Da Cheng, Taoyuan (TW); Tzy-Kuang Lee, Taichung (TW); Hao Chun Liu, Hsinchu (TW); Po-Hao Tsai, Zhongli (TW); Chih-Hsien Lin, Tainan (TW); Ching-Wen Hsiao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 79 days.

(21) Appl. No.: 17/112,119

(22) Filed: Dec. 4, 2020

(65) Prior Publication Data

US 2021/0375672 A1  Dec. 2, 2021

Related U.S. Application Data

(60) Provisional application No. 63/030,629, filed on May 27, 2020.

(51) Int. Cl.
| | |
|---|---|
| *H01L 21/768* | (2006.01) |
| *H01L 21/48* | (2006.01) |
| *H01L 23/00* | (2006.01) |
| *H01L 23/532* | (2006.01) |
| *H01L 21/60* | (2006.01) |

(52) U.S. Cl.
CPC .... *H01L 21/76877* (2013.01); *H01L 21/4825* (2013.01); *H01L 21/76802* (2013.01); *H01L 23/53228* (2013.01); *H01L 24/14* (2013.01); *H01L 2021/60022* (2013.01)

(58) Field of Classification Search
CPC ................ H01L 24/14; H01L 21/4857; H01L 23/49822; H01L 21/76877; H01L 21/76802
See application file for complete search history.

(56) References Cited

U.S. PATENT DOCUMENTS

| | | | | |
|---|---|---|---|---|
| 5,635,423 | A * | 6/1997 | Huang ................ | H01L 21/7681 438/700 |
| 6,731,004 | B2 * | 5/2004 | Saitoh .................... | H01L 24/11 257/750 |
| 7,635,643 | B2 * | 12/2009 | Daubenspeck ......... | H01L 24/05 257/738 |

(Continued)

*Primary Examiner* — Phat X Cao
(74) *Attorney, Agent, or Firm* — Slater Matsil, LLP

(57) ABSTRACT

A method includes forming a patterned mask comprising a first opening, plating a conductive feature in the first opening, depositing a passivation layer on a sidewall and a top surface of the conductive feature, and patterning the passivation layer to form a second opening in the passivation layer. The passivation layer has sidewalls facing the second opening. A planarization layer is dispensed on the passivation layer. The planarization layer is patterned to form a third opening. After the planarization layer is patterned, a portion of the planarization layer is located in the second opening and covers the sidewalls of the passivation layer. An Under-Bump Metallurgy (UBM) is formed to extend into the third opening.

20 Claims, 24 Drawing Sheets

(56) References Cited

U.S. PATENT DOCUMENTS

| | | | |
|---|---|---|---|
| 10,424,573 B1* | 9/2019 | Lim | H01L 24/82 |
| 11,626,490 B2* | 4/2023 | Ueno | H01L 29/872 |
| | | | 257/77 |
| 2008/0001290 A1* | 1/2008 | Chou | H01L 23/53252 |
| | | | 257/E23.079 |
| 2011/0101520 A1 | 5/2011 | Liu et al. | |
| 2017/0005052 A1 | 1/2017 | Chen et al. | |
| 2018/0040585 A1* | 2/2018 | Yu | H01L 23/49827 |
| 2019/0237251 A1* | 8/2019 | Jang | H01G 4/252 |
| 2020/0083184 A1* | 3/2020 | Baek | H01L 24/20 |
| 2020/0091099 A1* | 3/2020 | Choi | H01L 23/49838 |
| 2020/0303596 A1* | 9/2020 | Lim | H01L 33/60 |

\* cited by examiner

PASSIVATION LAYER AND PLANARIZATION LAYER AND METHOD OF FORMING THE SAME

PRIORITY CLAIM AND CROSS-REFERENCE

This application claims the benefit of the U.S. Provisional Application No. 63/030,629, filed on May 27, 2020, and entitled "Semiconductor Package Device with Pull-in Planarization Layer," which application is hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line may then be formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball may be placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
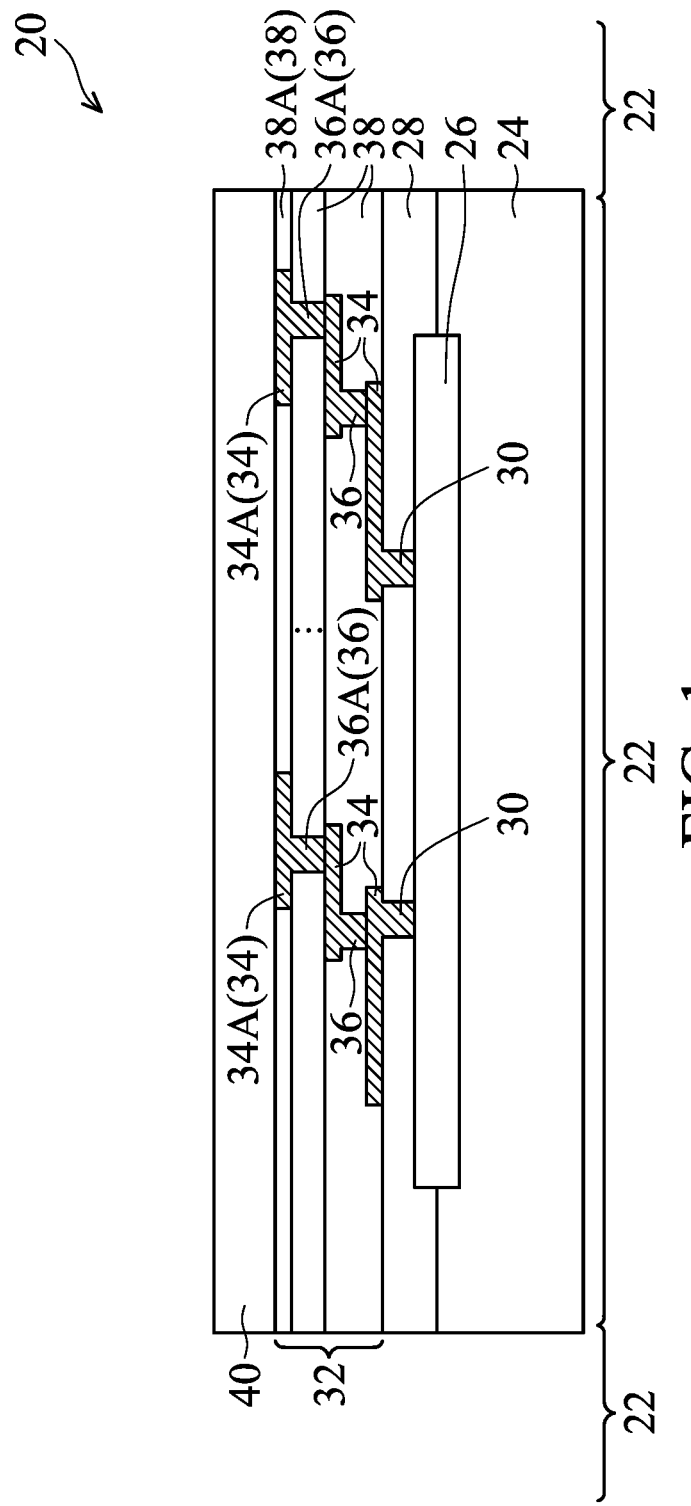
FIGS. 1 through 17 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device and the method of forming the same are provided in accordance with some embodiments. The device includes a redistribution line, a passivation layer on the redistribution line, and a polymer planarization layer on the passivation layer. An opening is formed in the passivation layer, so that another conductive feature such as an Under-Metal Metallurgy (UBM) may penetrate through the passivation layer to electrically connect to the redistribution line. The polymer planarization layer further extends into the opening of the passivation layer, so that the delamination between the polymer planarization layer and the passivation layer can be reduced. The intermediate stages in the formation of the package are illustrated in accordance with some embodiments. Some variations of some embodiments are discussed. Throughout the various views and illustrative embodiments, like reference numbers are used to designate like elements.

Figure 24:
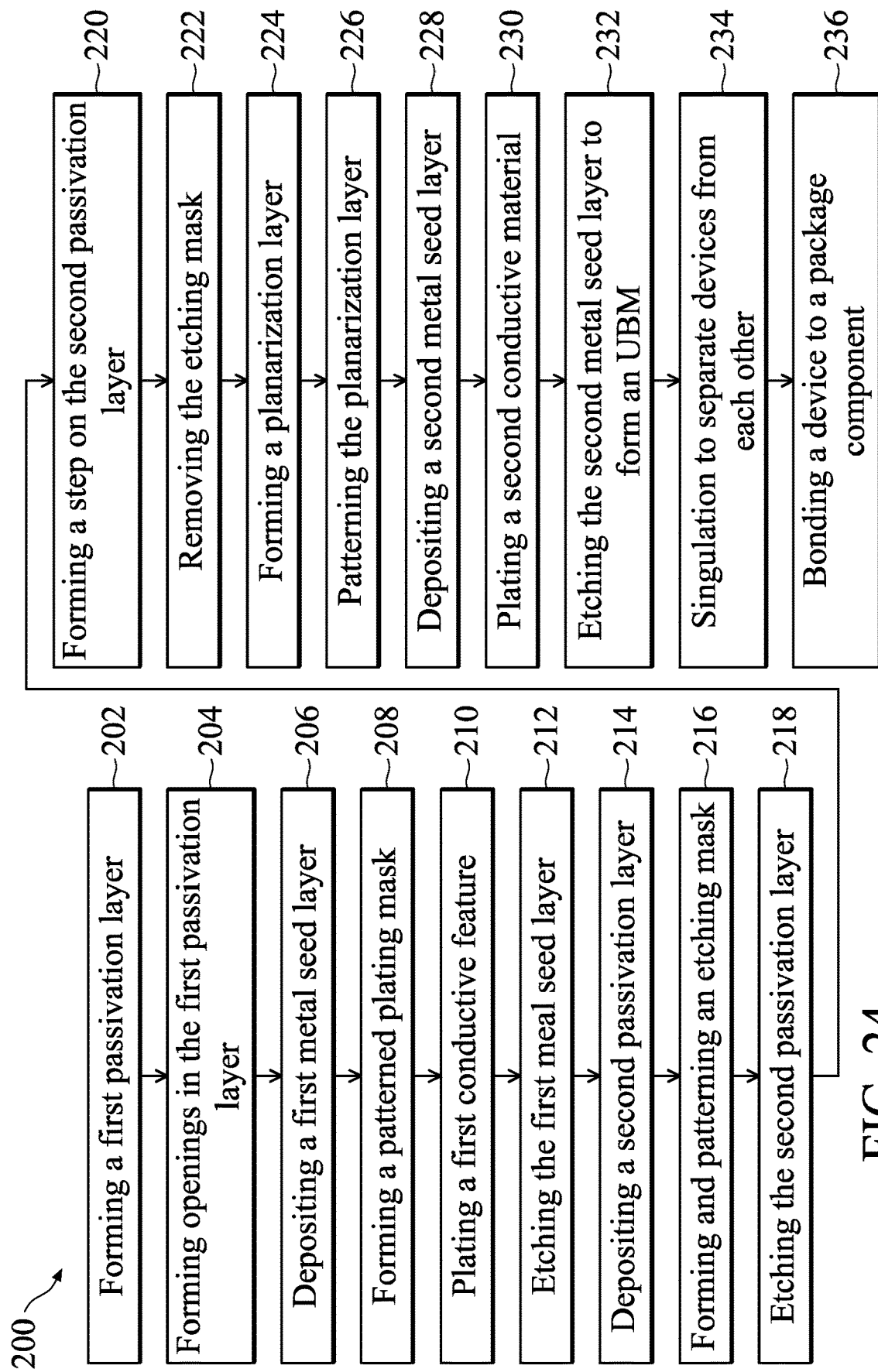
FIG. 24 illustrates a process flow for forming a device in accordance with some embodiments.

FIGS. 1 through 17 illustrate the cross-sectional views of intermediate stages in the formation of a package in accordance with some embodiments of the present disclosure. The corresponding processes are also reflected schematically in the process flow 200 as shown in FIG. 24. It is appreciated that although a device wafer and a device die are used as examples, the embodiments of the present disclosure may also be applied to form conductive features in other devices (package components) including, and not limited to, package substrates, interposers, packages, and the like.

FIG. 1 illustrates a cross-sectional view of integrated circuit device 20. In accordance with some embodiments of the present disclosure, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, a low-k dielectric material, or the like. ILD 28 may be formed using sping-on coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Passivation layer 40 (sometimes referred to as passivation-1 or pass-1) is formed over interconnect structure 32. The respective process is illustrated as process 202 in the process flow 200 as shown in FIG. 24. In accordance with some embodiments, passivation layer 40 is formed of a non-low-k dielectric material with a dielectric constant greater than or equal to the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon oxy-nitride ($SiON_x$), silicon oxy-carbide ($SiOC_x$), silicon carbide (SiC), or the like, combinations thereof, and multi-layers thereof. The value "x" represents the relative atomic ratio. In accordance with some embodiments, the top surfaces of top dielectric layer 38A and metal lines 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Figure 2:
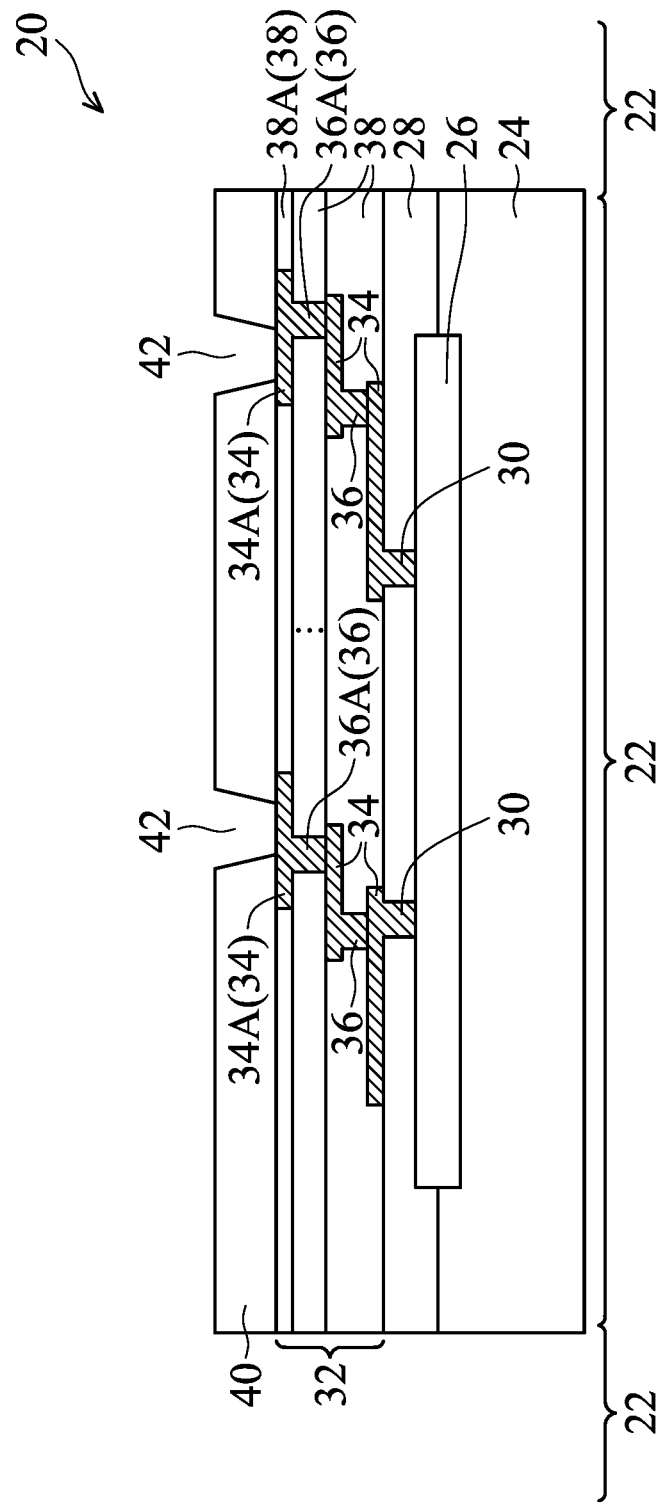

Referring to FIG. 2, passivation layer 40 is patterned in an etching process to form openings 42. The respective process is illustrated as process 204 in the process flow 200 as shown in FIG. 24. The etching process may include a dry etching process, which includes forming a patterned etching mask (not shown) such as a patterned photo resist, and then etching passivation layer 40. The patterned etching mask is then removed. Metal lines 34A are exposed through openings 42.

Figure 3:
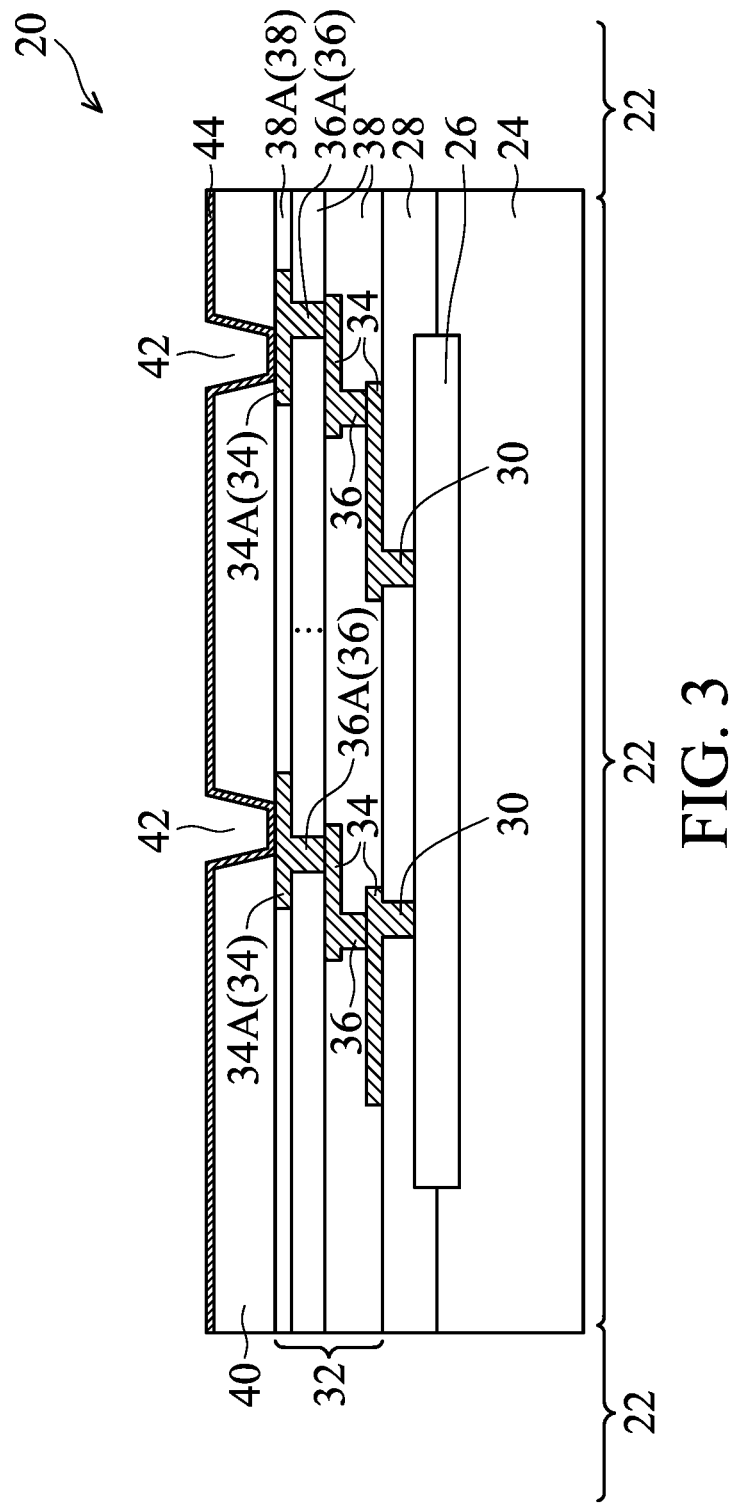

FIG. 3 illustrates the deposition of metal seed layer 44. The respective process is illustrated as process 206 in the process flow 200 as shown in FIG. 24. In accordance with some embodiments, metal seed layer 44 comprises a titanium layer and a copper layer over the titanium layer. In accordance with alternative embodiments, metal seed layer 44 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Figure 4:
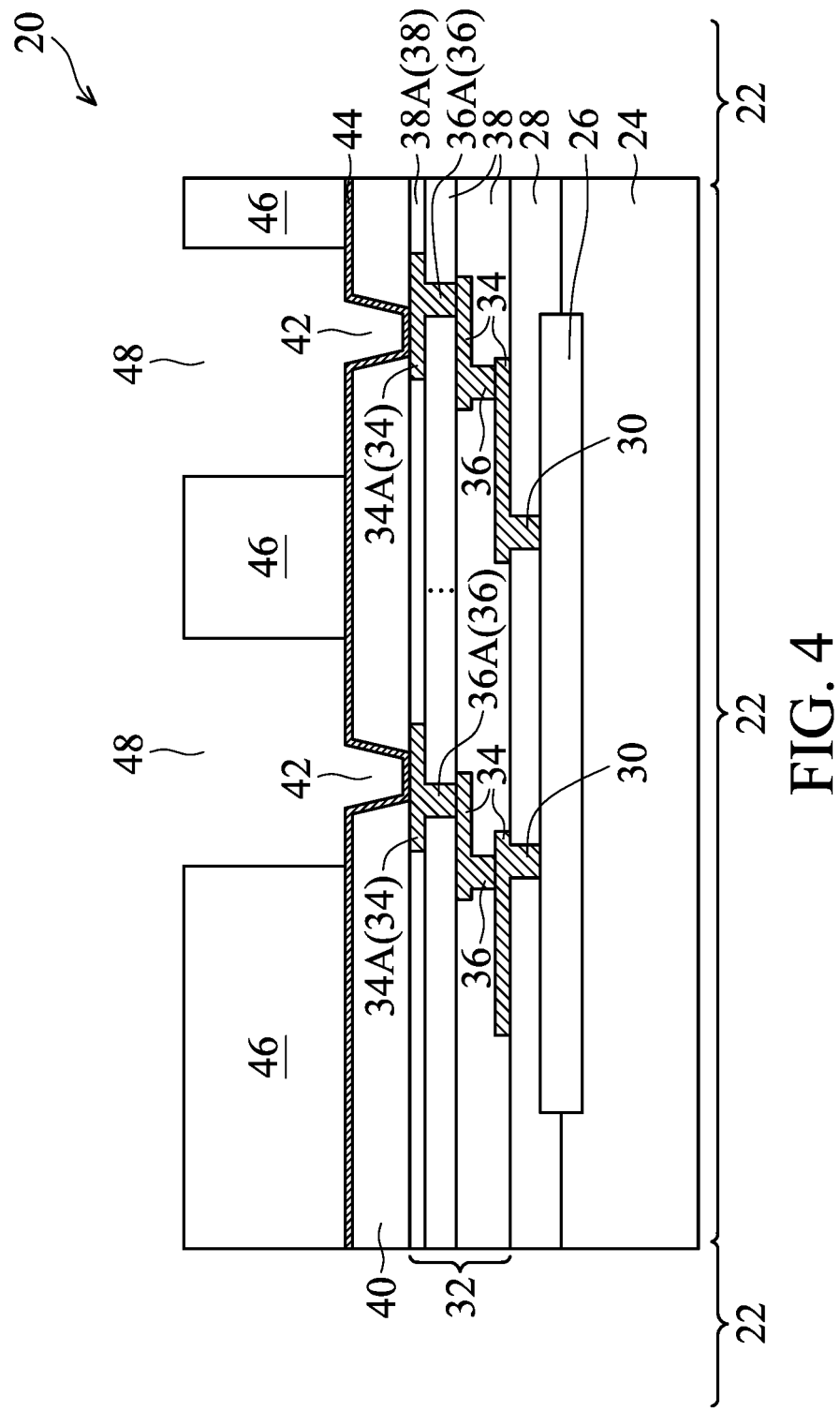

FIG. 4 illustrates the formation of patterned plating mask 46. The respective process is illustrated as process 208 in the process flow 200 as shown in FIG. 24. In accordance with some embodiments, plating mask 46 is formed of photo resist, and hence is alternatively referred to as photo resist 46. Openings 48 are formed in the patterned plating mask 46 to reveal metal seed layer 44.

Figure 5:
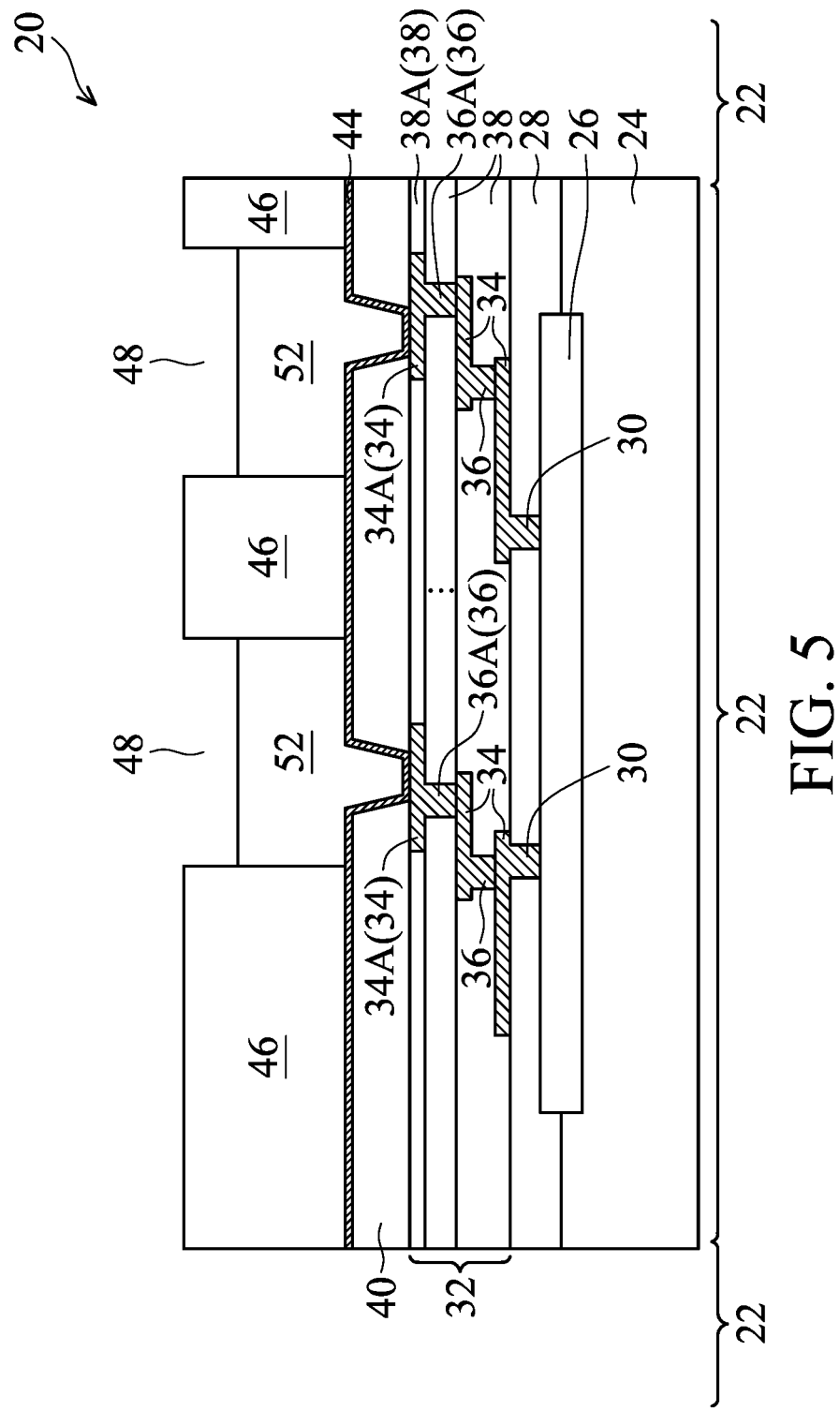

FIG. 5 illustrates the plating of conductive material (features) 52 into openings 48 and on metal seed layer 44. The respective process is illustrated as process 210 in the process flow 200 as shown in FIG. 24. In accordance with some embodiments of the present disclosure, the formation of conductive features 52 includes a plating process, which may include an electrochemical plating process, an electroless plating process, or the like. The plating is performed in a plating chemical solution. Conductive features 52 may include copper, aluminum, nickel, tungsten, or the like, or alloys thereof. In accordance with some embodiments, conductive features 52 comprise copper, and are free from aluminum.

Figure 6:
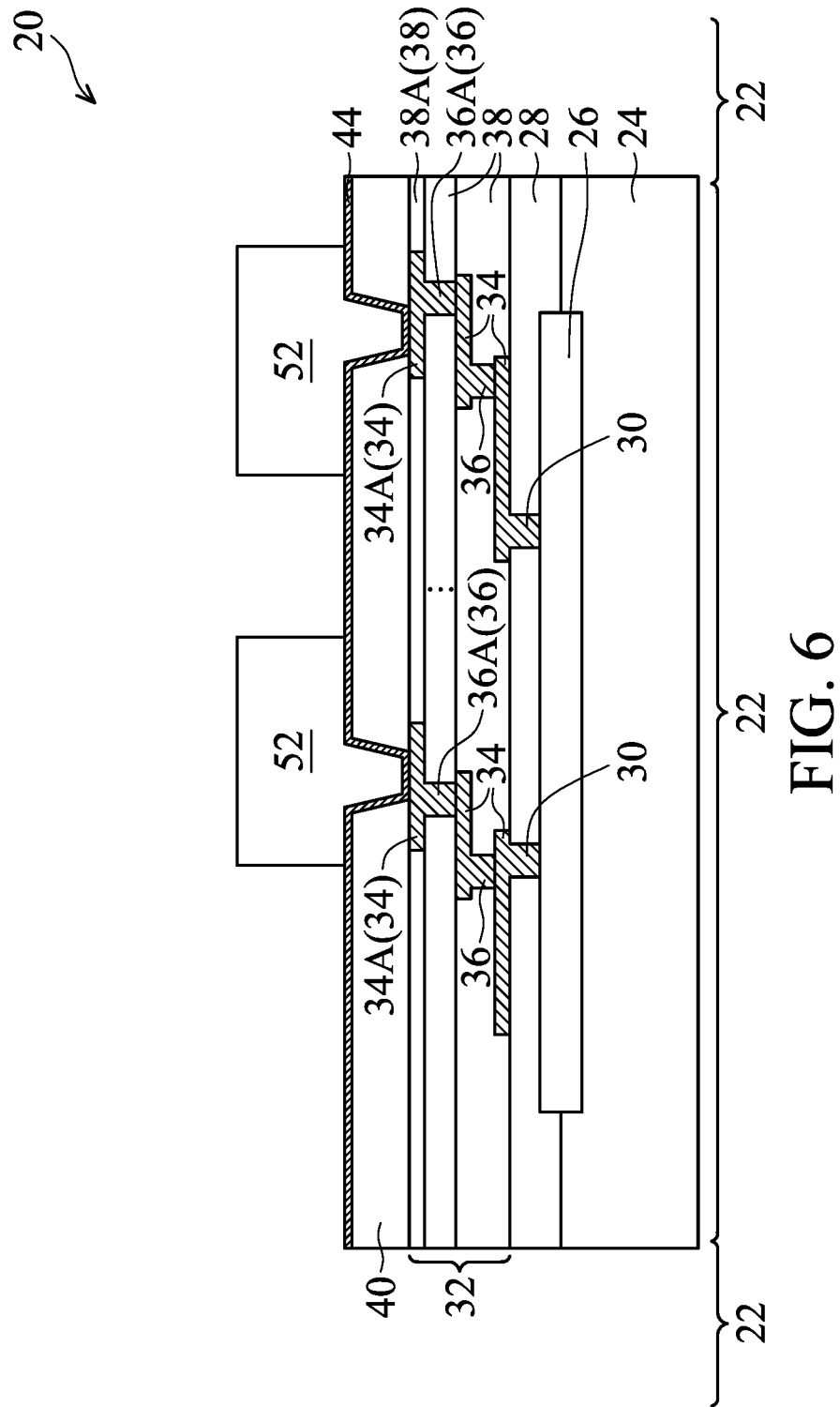
Figure 7:
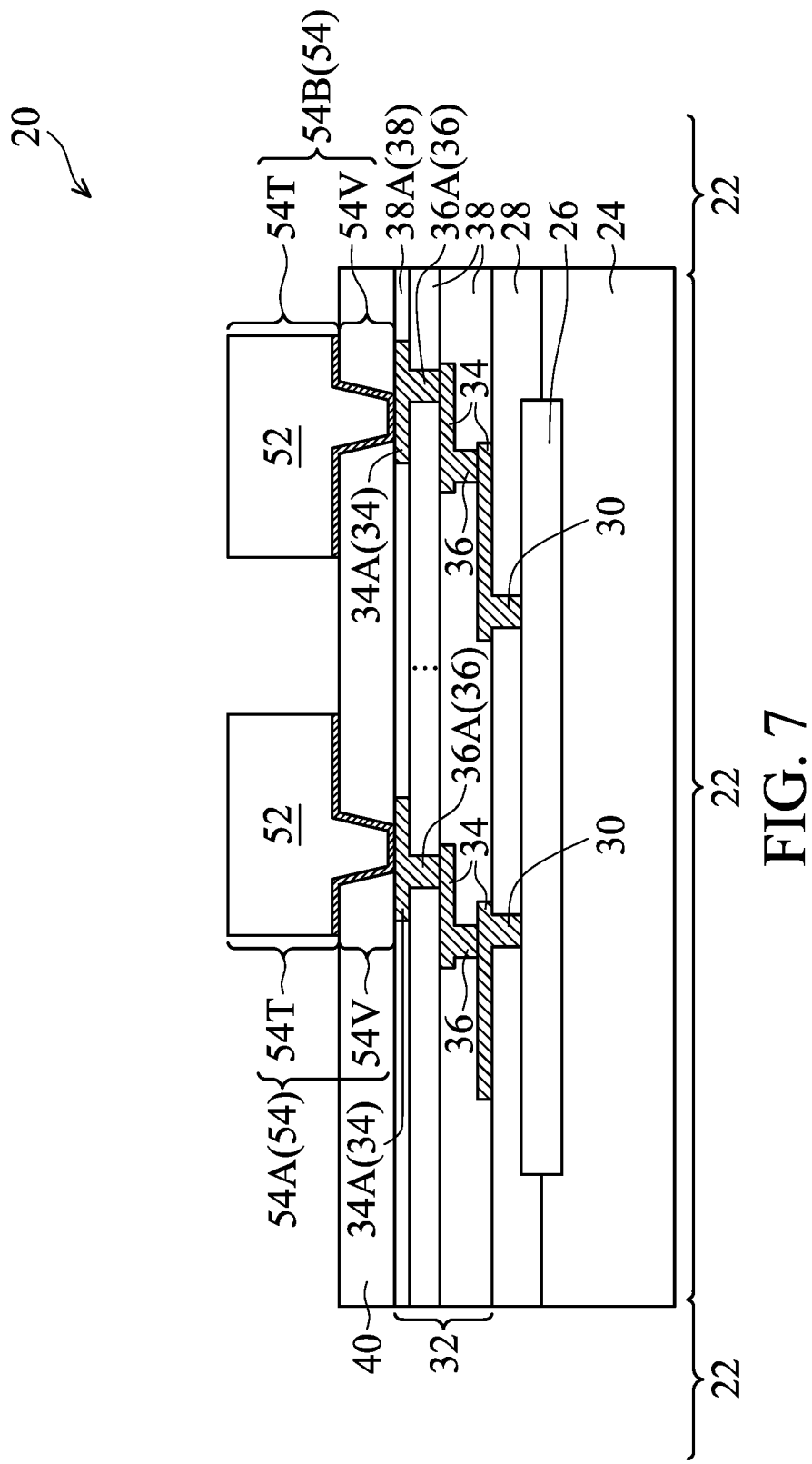

Next, photo resist (plating mask) 46 as shown in FIG. 5 is removed, and the resulting structure is shown in FIG. 6. In a subsequent process, an etching process is performed to remove the portions of metal seed layers 44 that are not protected by the overlying conductive features 52. The respective process is illustrated as process 212 in the process flow 200 as shown in FIG. 24. The resulting structure is shown in FIG. 7. Throughout the description, conductive features 52 and the corresponding underlying metal seed layers 44 are collectively referred to as Redistribution Lines (RDLs) 54, which include RDL 54A and RDL 54B. Each of RDLs 54 may include a via portion 54V extending into passivation layer 40, and a trace/line portion 54T over passivation layer 40.

Figure 8:
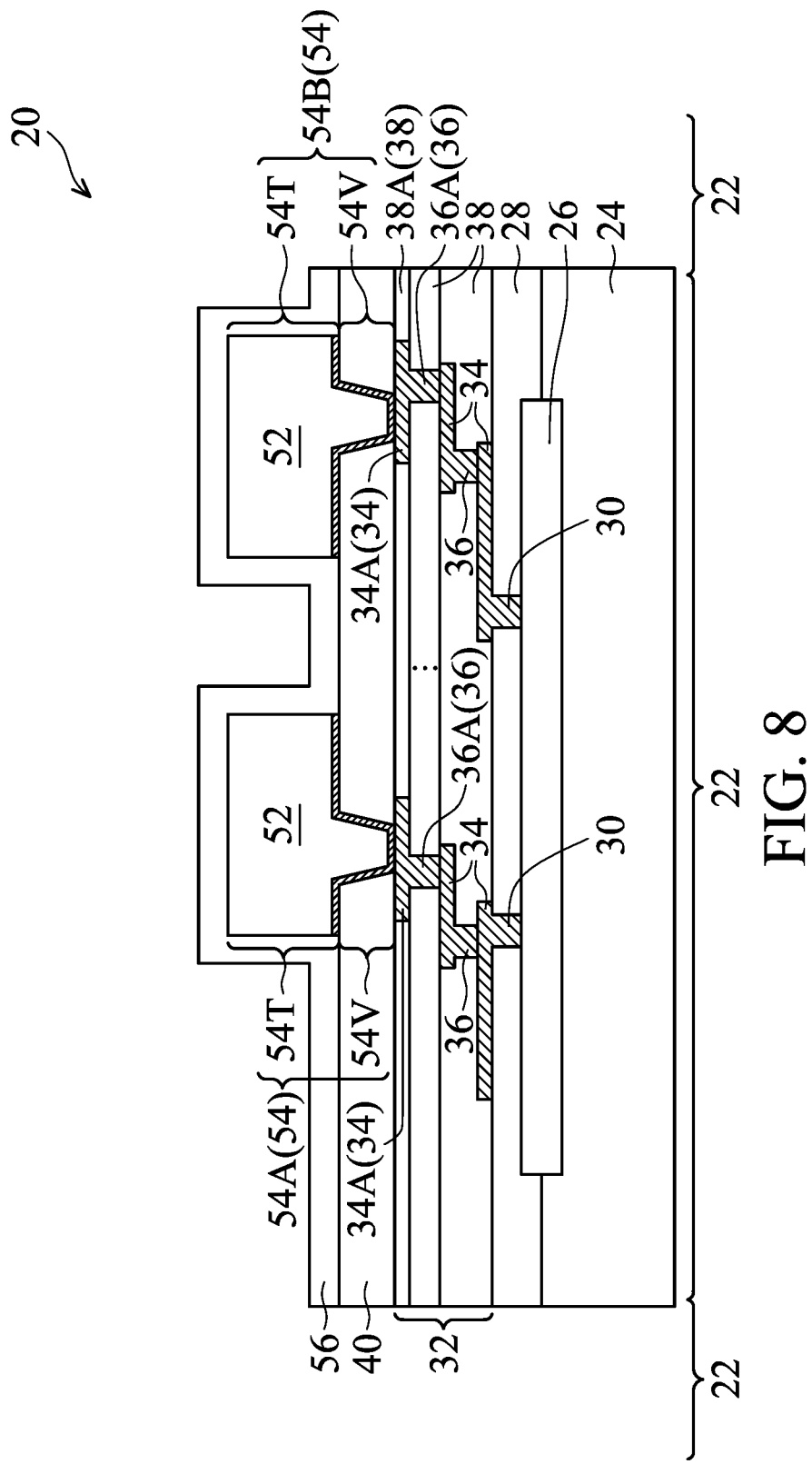

Referring to FIG. 8, passivation layer 56 is deposited. The respective process is illustrated as process 214 in the process flow 200 as shown in FIG. 24. Passivation layer 56 (sometimes referred to as passivation-2 or pass-2) is formed as a blanket layer. In accordance with some embodiments, passivation layer 56 is formed of or comprises an inorganic dielectric material, which may include, and is not limited to, silicon nitride, silicon oxide, silicon oxy-nitride, silicon oxy-carbide, silicon carbide, or the like, combinations thereof, or multi-layers thereof. The material of passivation layer 56 may be the same or different from the material of passivation layer 40. The deposition may be performed through a conformal deposition process such as Atomic Layer Deposition (ALD), CVD, or the like. Accordingly, the vertical portions and horizontal portions of passivation layer 56 have the same thickness or substantially the same thickness, for example, with a variation smaller than about 20 percent or smaller than about 10 percent. It is appreciated that regardless of whether passivation layer 56 is formed of a same material as passivation layer 40 or not, there may be, or may not be, a distinguishable interface in between, which may be visible, for example, in a Transmission Electron Microscopy (TEM) image, an X Ray Diffraction (XRD) image, or an Electron Back Scatter Diffraction (EBSD) image of the structure.

Figure 9:
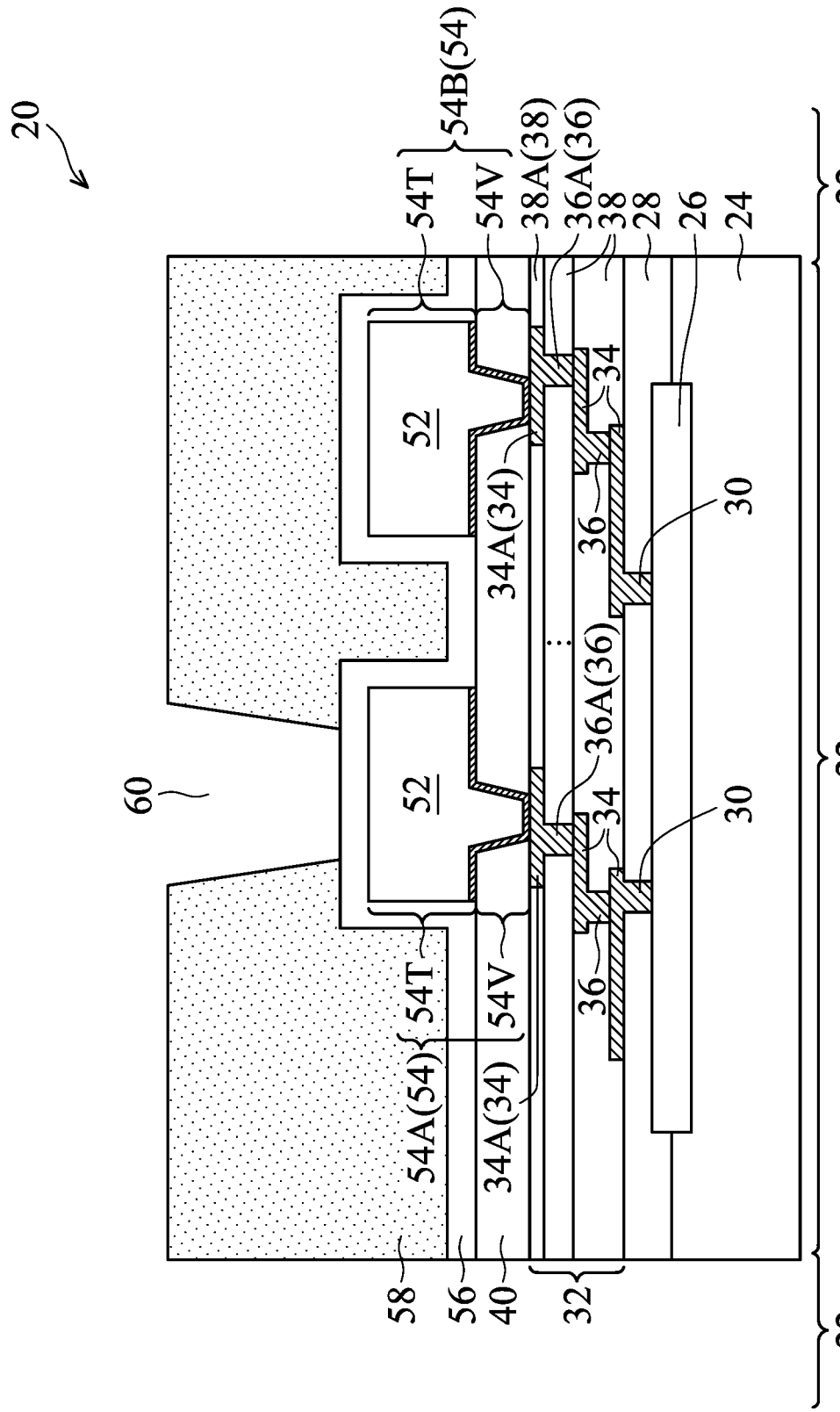

Referring to FIG. 9, an etching mask 58 is dispensed and then patterned, forming opening 60. The respective process is illustrated as process 216 in the process flow 200 as shown in FIG. 24. Etching mask 58 may be formed of photo resist or a polymer. The polymer may be photo sensitive or non-photo-sensitive. The photo sensitive polymer for forming etching mask 58 may comprise polyimide, polybenzoxazole (PBO), benzocyclobutene (BCB), or the like. The patterning of etching mask 58, when it is photo sensitive, may include performing a photo-exposure process on the etching mask 58, and then developing etching mask 58 to form opening 60. In accordance with alternative embodiments in which etching mask 58 is non-photo-sensitive, for example, when etching mask 58 comprises a non-photo-sensitive epoxy/polymer, the patterning of etching mask 58 may include applying and patterning a photo resist over the etching mask 58, and etching the etching mask 58 using the patterned photo resist to define patterns of openings. The material of etching mask 58 is selected so that in the subsequent etching processes, there is a suitable lateral etching rate in order to laterally recess etching mask 58 and to form a step or steps.

Figure 10:
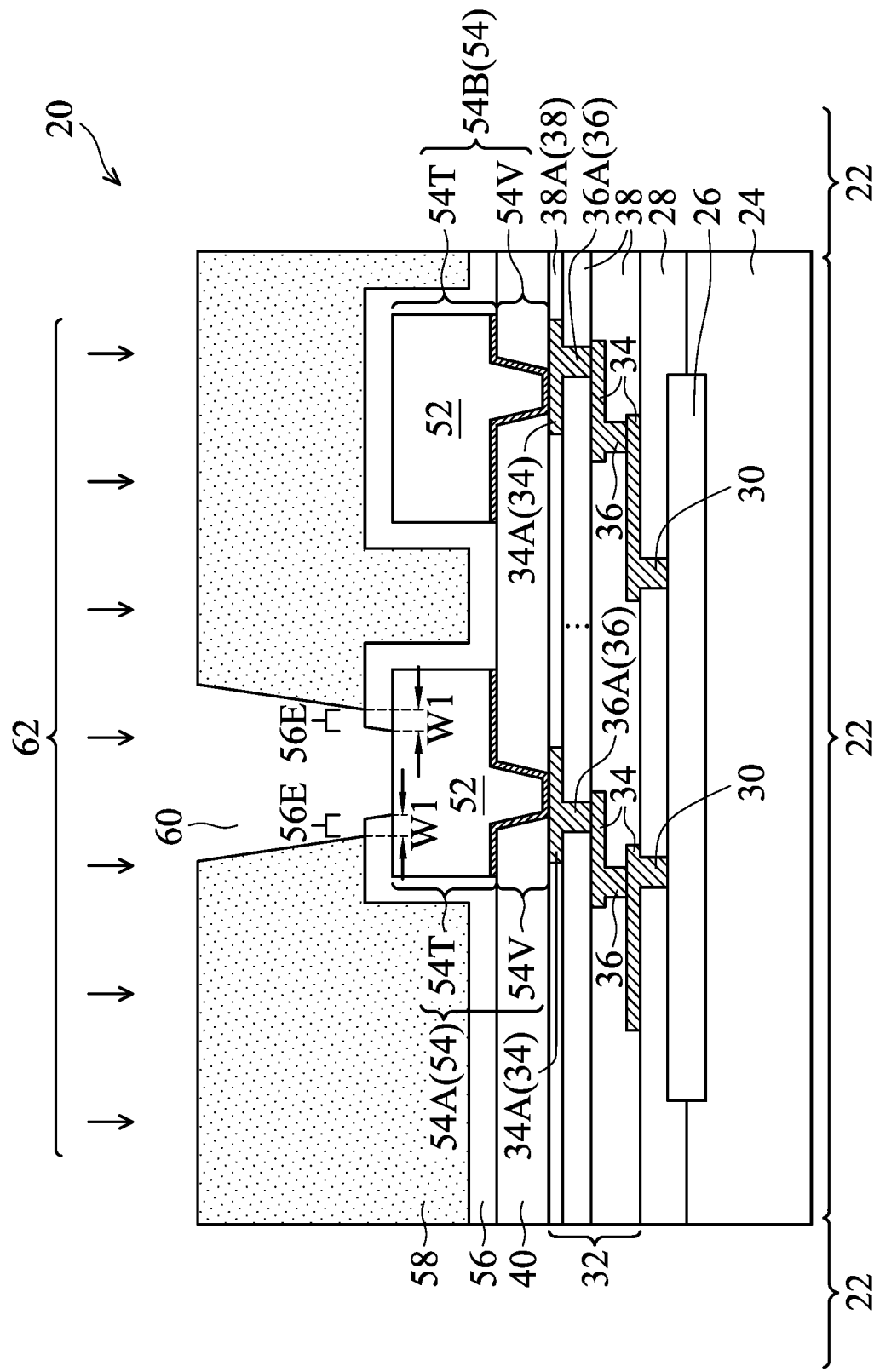

Referring to FIG. 10, an etching process 62 is performed to etch-through passivation layer 56, so that opening 60 extends into passivation layer 56. The respective process is illustrated as process 218 in the process flow 200 as shown in FIG. 24. In accordance with alternative embodiments, the etching process 62 is performed through a Reactive Ion Etching (RIE) process. The etching gas may include a carbon-and-fluorine-containing gas, argon, oxygen ($O_2$), and nitrogen ($N_2$). The carbon-and-fluorine-containing gas may include $CF_4$, $CH_2F_2$, $CHF_3$, or the like, or combinations thereof, with the flow rate being in the range between about 200 sccm and about 500 sccm. The argon flow rate may be in the range between about 150 sccm and about 450 sccm. The oxygen flow rate may be in the range between about 10 sccm and about 120 sccm. The nitrogen flow rate may be in the range between about 20 sccm and about 140 sccm. The etching time may be in the range between about 35 seconds and about 60 seconds.

In accordance with other embodiments, etching process 62 is performed using argon as a process gas. The etching process 62 (although referred to as being etching) actually includes a bombardment process, and may or may not include chemical etching effect. The chemical etching effect, if exists, is caused by the reactive gases such as the carbon-and-fluorine-containing gas and oxygen ($O_2$).

The etching process 62 is mainly an anisotropic etching process, which may be achieved by applying a low-frequency bias power, a relatively high source power and a relatively high argon flow rate, which power and the flow rate are higher relatively to the subsequently performed etching process 64. In accordance with some embodiments, the low-frequency of the power (bias power) is in the range between about 0.3 MHz and about 3 MHz. The relatively high source power may be about 1,800 watts or lower. With the relatively high low-frequency bias power and the relatively high argon flow rate, anisotropic etching is achieved, while at the same time, etching mask 58 is laterally etched (faster than the lateral etching of passivation layer 56, which may be or may not be etched laterally) by the reactive gases in the process gas. Accordingly, some portions of passivation layer 56 extend beyond the corresponding edges of etching mask 58 to form extension portions 56E. A high-frequency RF power source may also be provided in addition to the low-frequency power, with the power being in the range between about 300 watts and about 1,500 watts. The high-frequency RF power may have a frequency in the range between about 3 MHz and about 30 MHz.

Figure 11:
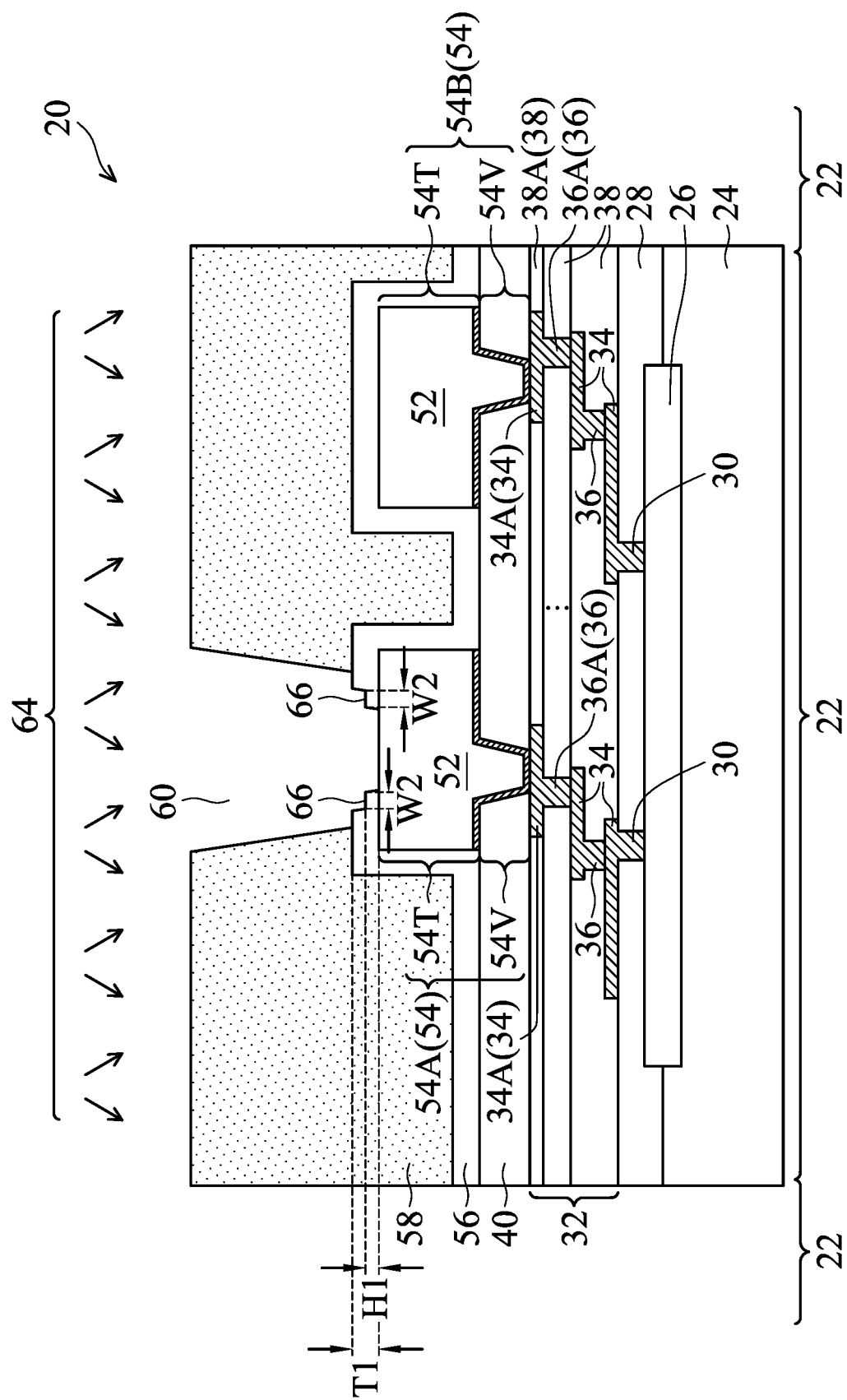

Referring to FIG. 11, etching process 64 is performed to form step 66 in passivation layer 56. The respective process is illustrated as process 220 in the process flow 200 as shown in FIG. 24. The etching process 64 is mainly anisotropic through a dry etching process. The etching process 64 may, or may not, include some isotropic effect. In accordance with these embodiments, the anisotropic effect is combined with the isotropic etching effect, while the vertical etching rate is greater than the horizontal etching rate. The etching process may be achieved using a high-frequency power source, with a relatively low power and a lower argon flow rate than etching process 62. In accordance with some embodiments, the high-frequency of the low-frequency power source is in the range between about 3 MHz and about 30 MHz, and may be equal to or different from the high-frequency of the power used in etching process 62. The source power used by etching process 64 is lower than the source power used in etching process 62, and may be in the range between about 50 watts and about 700 watts. In some embodiments, the bias power is not provided.

Figure 23:
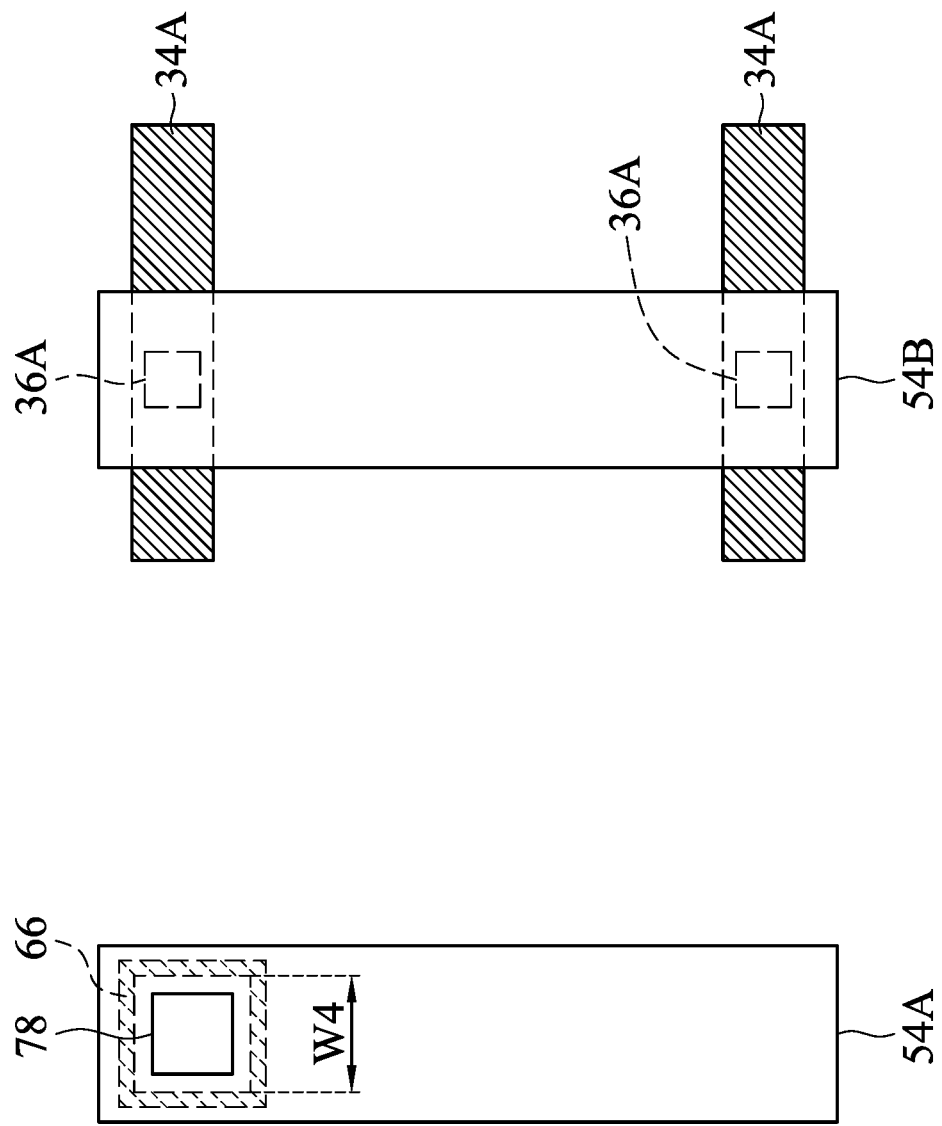
FIG. 23 illustrates the top view of two redistribution lines in accordance with some embodiments.

Due to the vertical component of the isotropic etching, the extension portions 56E are etched, with their top surfaces lowered to form steps 66, which are formed by the lowered top surface of passivation layer 56. In a top view, steps 66 are portions of a step ring as shown in FIG. 23. In the meantime, the isotropic etching further has lateral component, which may result in the further lateral recessing of etching mask 58. In accordance with some embodiments, the height ratio H1/T1 is in the range between about ¼ and ¾, wherein height H1 is the height of step 66, and thickness T1 is the thickness of the portion of passivation layer 56 directly over conductive RDL 54A. The width W2 of the steps 66 may be in the range between about 0.8 µm and about 3.2 µm.

In accordance with alternative embodiments, the formation of steps 66 may include the following processes. Etching mask 58 is first formed and patterned, forming the structure shown in FIG. 9. A first anisotropic process is performed to etch-through passivation layer 56 using a process gas attacking passivation layer 56. As a result of the first anisotropic etching process, the sidewalls of passivation layer 56 facing opening 60 are flush with the sidewalls of etching mask 58. Next, an isotropic etching process is performed using a process gas attacking etching mask 58, but not attacking passivation layer 56. Due to the isotropic etching process, the sidewalls of etching mask 58 facing opening 60 is laterally recessed, so that more top surfaces of passivation layer 56 previously covered by etching mask 58 are exposed.

A second anisotropic etching process is then performed, for example, using a process gas that attacks passivation layer 56. In the second anisotropic etching process, the top surface of the exposed passivation layer 56 reduces in height, forming steps 66.

Figure 12:
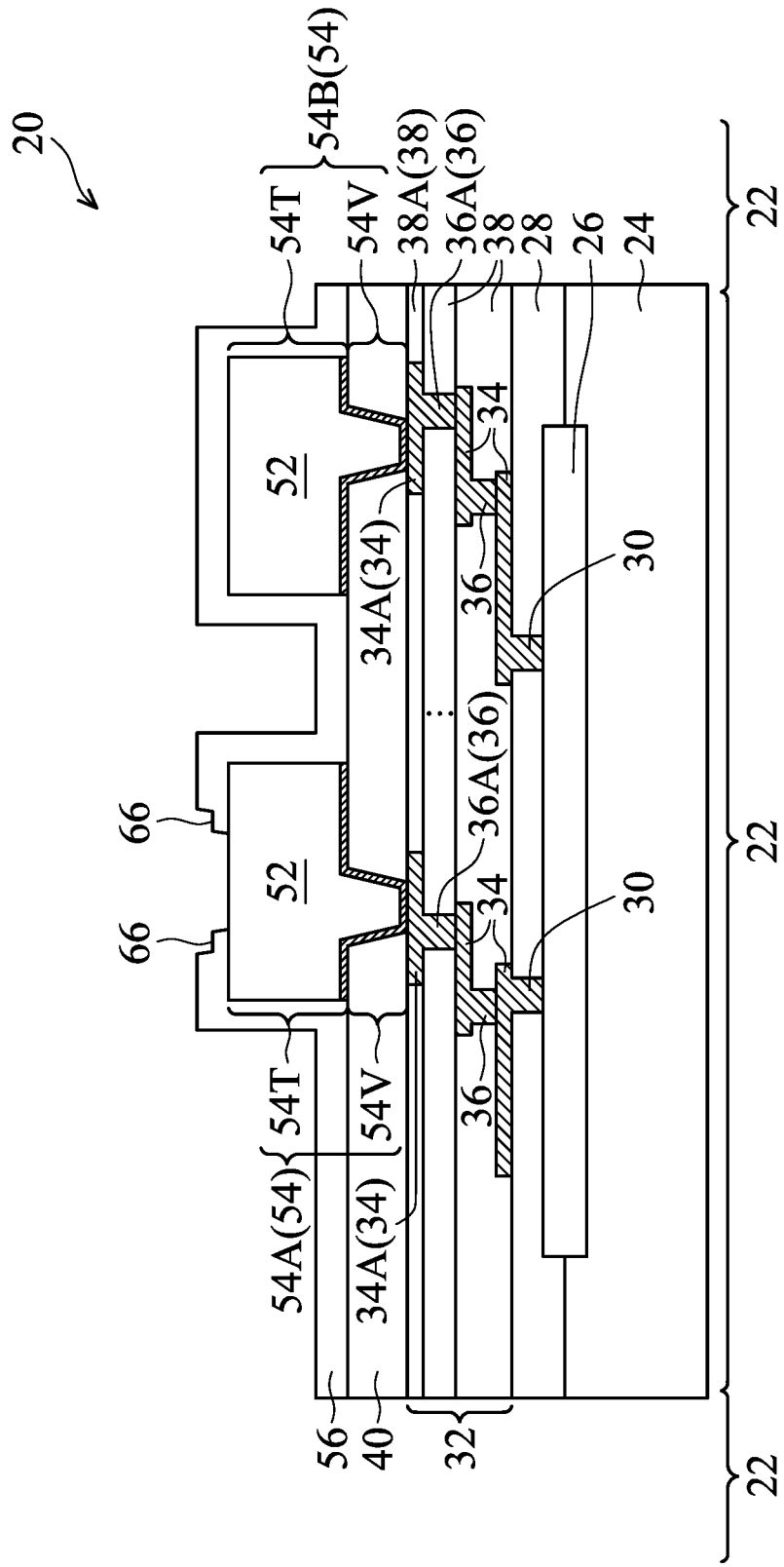
Figure 13:
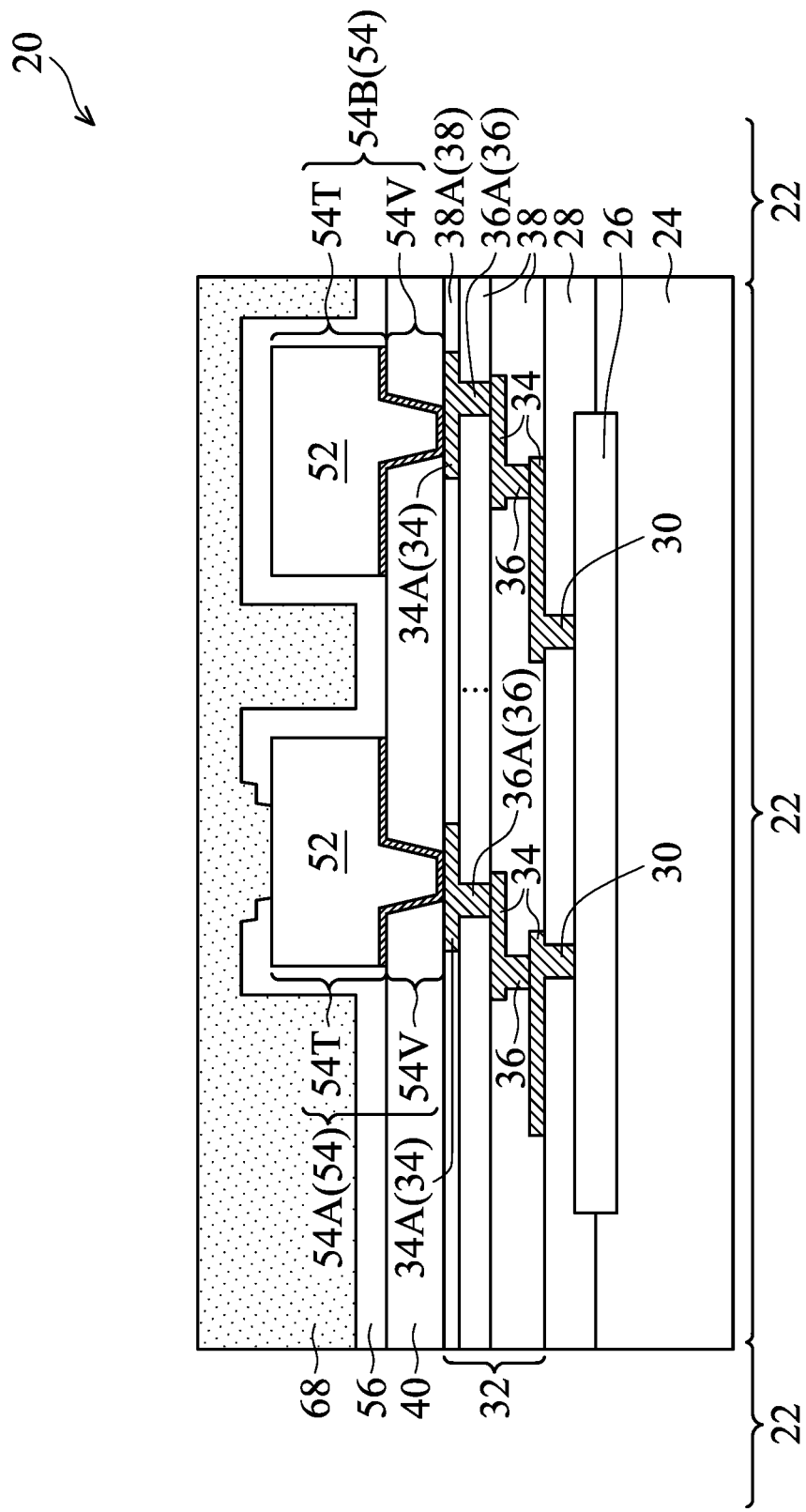

In a subsequent process, etching mask 58 is removed, and the resulting structure is shown in FIG. 12. The respective process is illustrated as process 222 in the process flow 200 as shown in FIG. 24. FIG. 13 illustrates the formation of planarization layer 68. The respective process is illustrated as process 224 in the process flow 200 as shown in FIG. 24. In accordance with some embodiments of the present disclosure, planarization layer 68 is formed of a polymer (which may be photo-sensitive) such as polyimide, polybenzoxazole (PBO), benzocyclobutene (BCB), an epoxy, or the like. Planarization layer 68 may be formed of the same polymer as, or a different polymer than, etching mask 58 when etching mask 58 is formed of a polymer. In accordance with some embodiments, the formation of planarization layer 68 includes coating the planarization layer in a flowable form, and then curing to harden planarization layer 68. A planarization process such as a mechanical grinding process may be (or may not be) performed to level the top surface of planarization layer 68.

Figure 14:
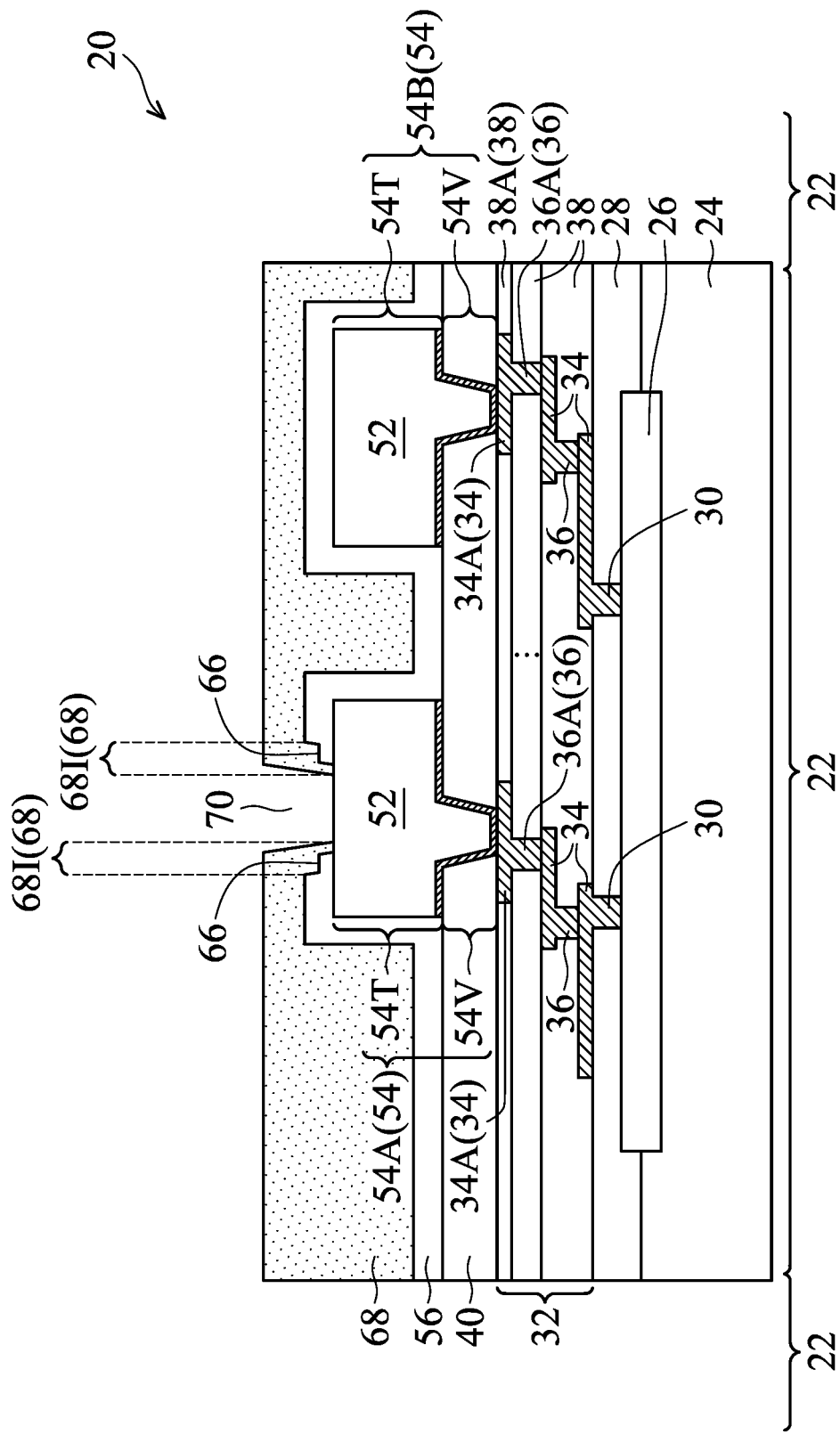

Referring to FIG. 14, planarization layer 68 is patterned, for example, through a light-exposure process followed by a photo-development process. The respective process is illustrated as process 226 in the process flow 200 as shown in FIG. 24. Opening 70 is thus formed in planarization layer 68, and passivation layer 56 is exposed. In accordance with some embodiments, planarization layer 68 fully covers steps 66 and the sidewalls of passivation layer 56. Accordingly, planarization layer 68 comprises portions 681 on the inner sides of passivation layer 56. This is different from conventional structures, in which the edges of the corresponding planarization layer recess away from the edges of passivation layer 56 in a way similar to how etching mask 58 (FIG. 10) is laterally recessed. Accordingly, in conventional structures, the planarization layer is more likely to delaminate from passivation layer 56. In the embodiments of the present disclosure, planarization layer 68 has portions 681 extending down to RDL 54A. The lower parts of portions 681 act as the anchors, so that planarization layer 68 is less likely to peel from passivation layer 56.

Figure 15:
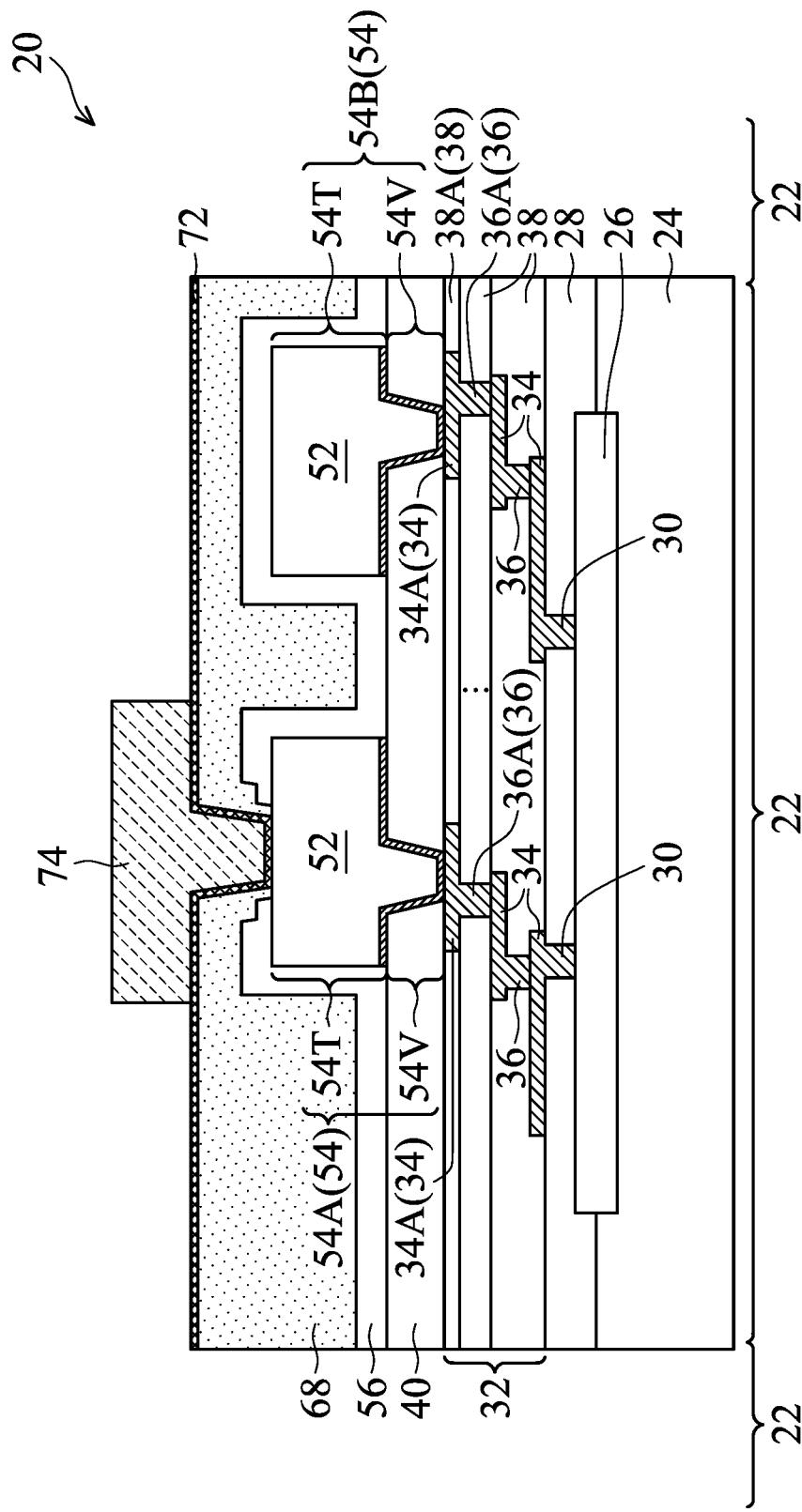

FIG. 15 illustrates the deposition of metal seed layer 72. The respective process is illustrated as process 228 in the process flow 200 as shown in FIG. 24. In accordance with some embodiments, metal seed layer 72 includes a titanium layer and a copper layer over the titanium layer. In accordance with alternative embodiments, metal seed layer 72 comprises a copper layer in contact with planarization layer 68, passivation layer 56, and the top surface of conductive feature 52.

Next, conductive region 74 is plated. The respective process is illustrated as process 230 in the process flow 200 as shown in FIG. 24. The process for plating conductive region 74 may include forming a patterned plating mask (for example, a photo resist, not shown), and plating conductive region 74 in an opening in the plating mask. Conductive region 74 may comprise copper, nickel, palladium, aluminum, a lead-free solder, alloys thereof, and/or multi-layers thereof. The plating mask is then removed.

Figure 16:
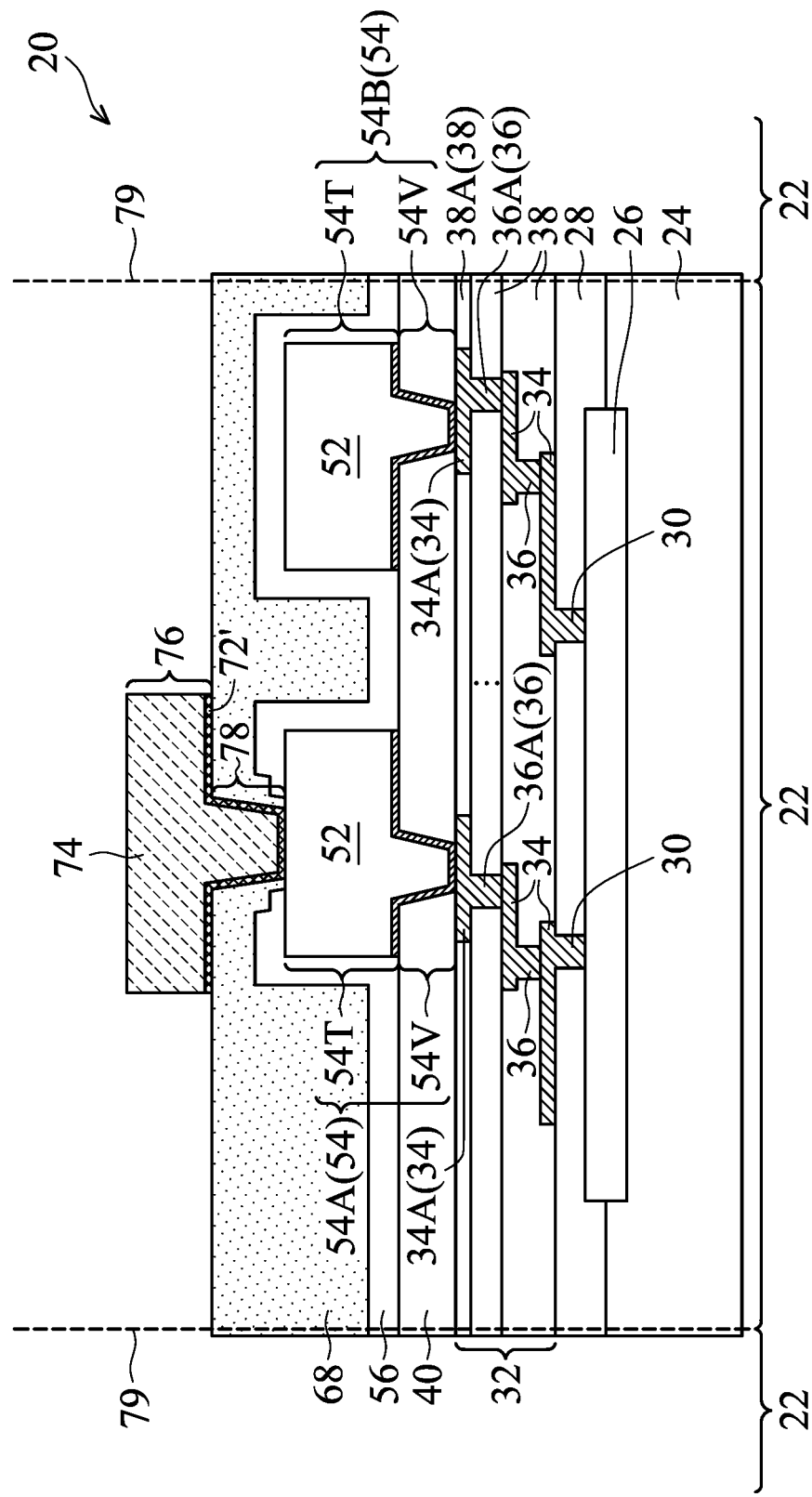

Metal seed layer 72 is then etched, and the portions of metal seed layer 72 that are exposed after the removal of the plating mask are removed, while the portions of metal seed layer 72 directly underlying conductive region 74 are left. The respective process is illustrated as process 232 in the process flow 200 as shown in FIG. 24. The resulting structure is shown in FIG. 16. A remaining portion of metal seed layer 72 is referred to as Under-Bump Metallurgy (UBM) 72'. UBM 72' and conductive region 74 in combination form via 78 and electrical connector 76 (which is also referred to as a bump).

In a subsequent process, wafer 20 is singulated, for example, sawed along scribe lines 79 to form individual device dies 22. The respective process is illustrated as process 234 in the process flow 200 as shown in FIG. 24. Device dies 22 are also referred to as devices 22 or package components 22 since devices 22 may be used for bonding to other package components in order to form packages. As aforementioned, devices 22 may be device dies, interposers, package substrate, packages, or the like.

Figure 17:
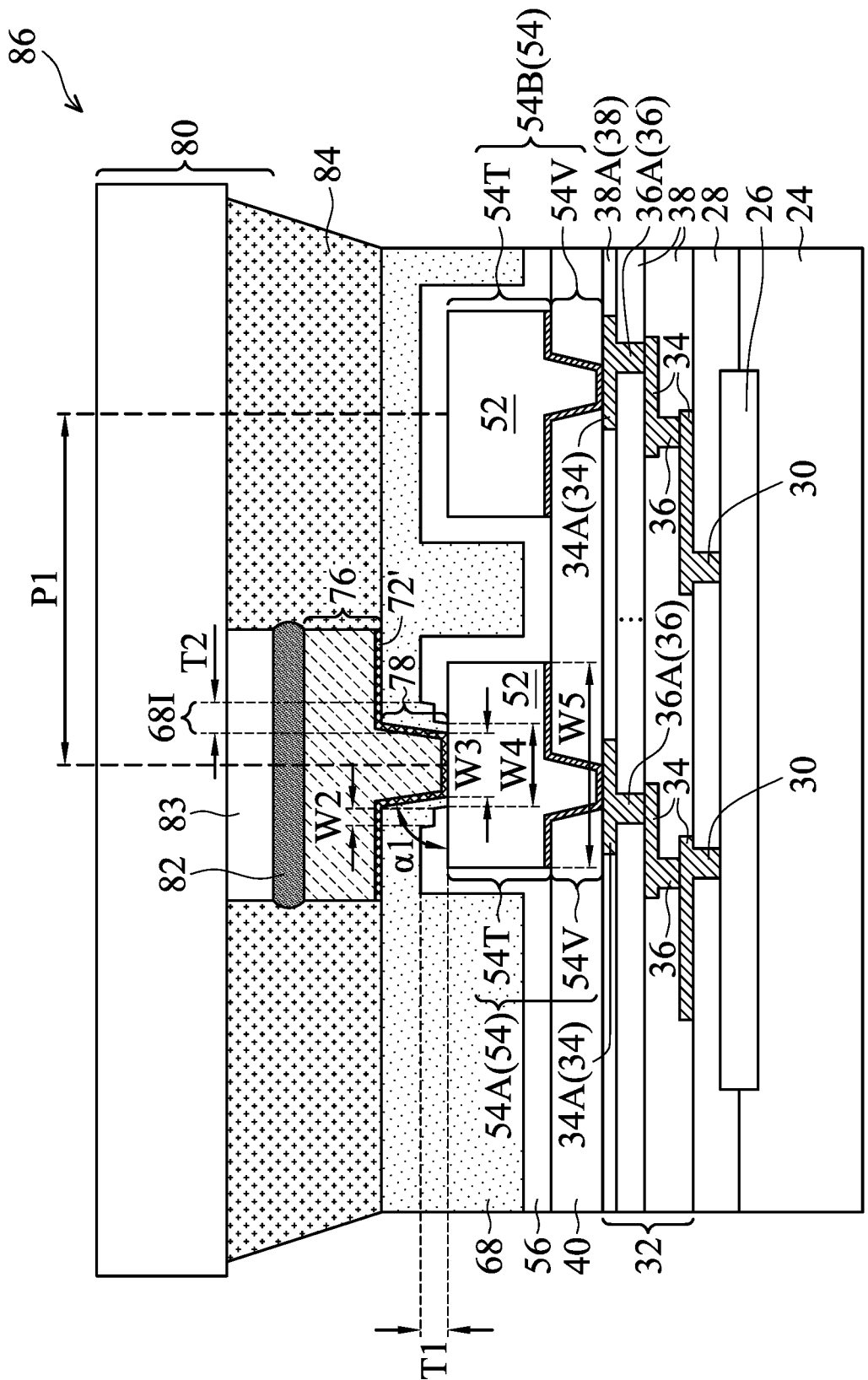

Referring to FIG. 17, device 22 is bonded with package component 80 to form package 86. The respective process is illustrated as process 236 in the process flow 200 as shown in FIG. 24. In accordance with some embodiments, package component 80 is or comprises an interposer, a package substrate, a printed circuit board, a package, or the like. Electrical connector 83 in package component 80 may be bonded to package component 80 through solder region 82. Underfill 84 is dispensed between device 22 and package component 80.

In accordance with some embodiments, the bottom width W3 of via 78 is in the range between about 30 µm and about 45 µm. The opposing portions of passivation layer 56 on the opposite sides of via 78 are spaced apart from each other by distance W4, which may be in the range between about 40 µm and about 55 µm. Width W2 of steps 66 may be in the range between about 5 µm and about 15 µm. The pitch P1 between RDLs 54A and 54B may be in the range between about 110 µm and about 180 µm. The thickness T1 of the portions of passivation layer 56 on top of RDL 54 may be in the range between about 5 µm and about 10 µm. The width W5 of RDLs 54A and 54B may be in the range between about 70 µm and about 90 µm. It is appreciated that the portions 681 on the sidewalls of passivation layer 56 have better effect in preventing delamination when portions 681 are thicker. Accordingly, thickness T2 preferably has a high value. On the other hand, if portions 681 are too thick, the width of via 78 will be small, and the contact resistance will increase. In accordance with some embodiments, thickness T2 is greater than about 5 µm, and may be in the range between about 5 µm and about 15 µm.

Figure 20:
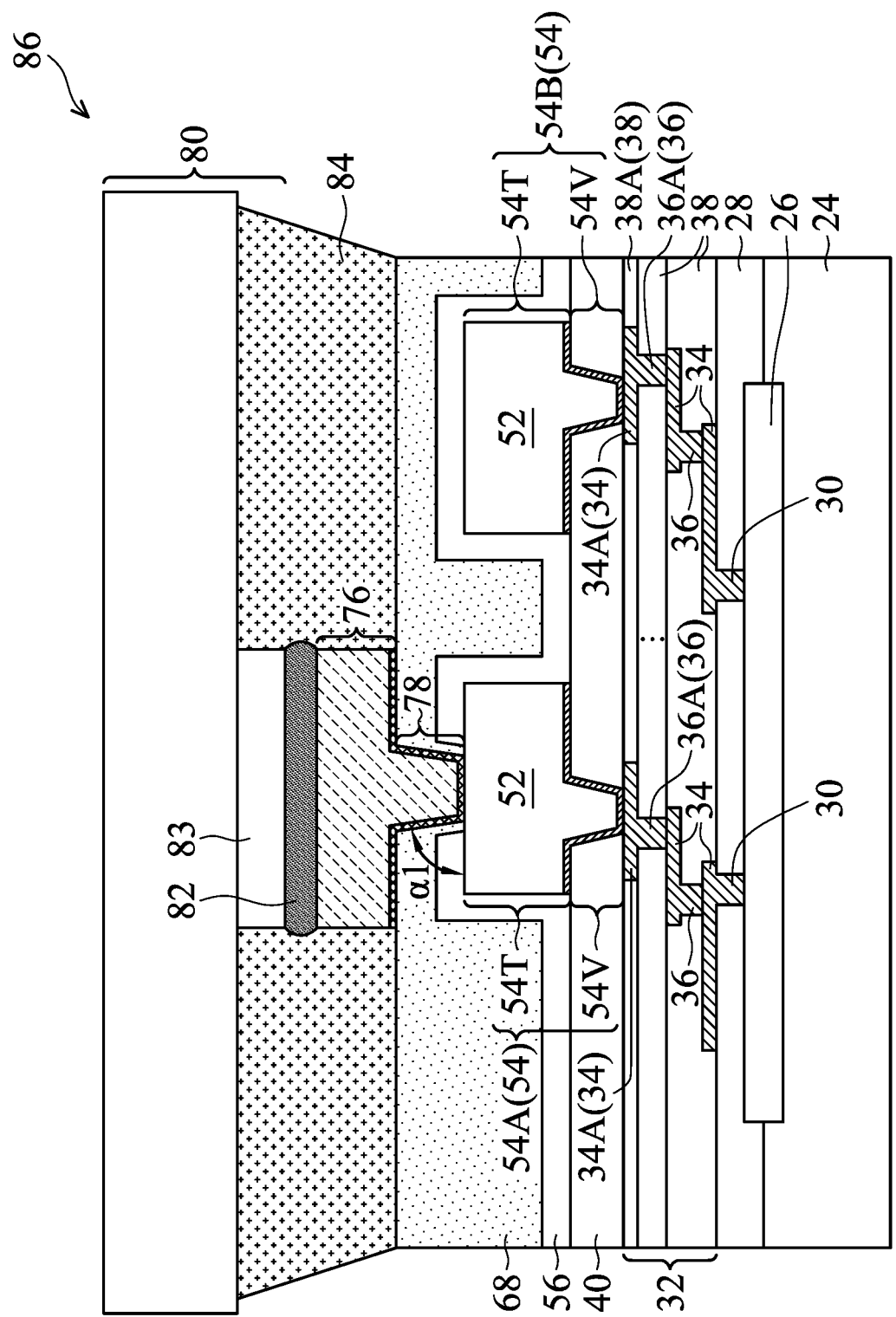
Figure 22:
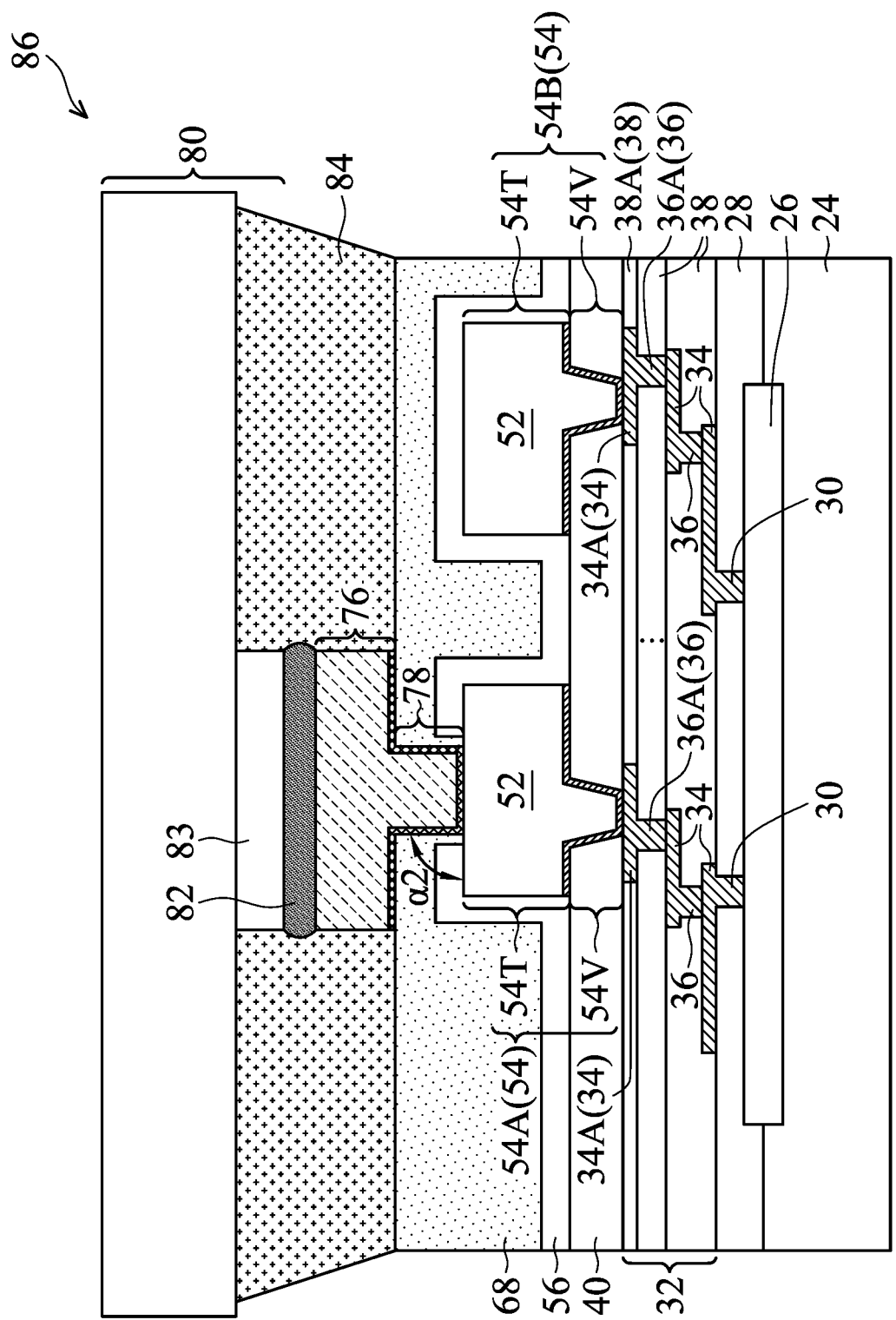

FIG. 23 illustrates the top view of two RDLs 54, which are also denoted as RDLs 54A and 54B (FIGS. 17, 20, and 22). In accordance with some embodiments, RDL 54A is used for electrically connecting electrical connector 76 to the underlying integrated circuit devices 26 (FIG. 17). The ring formed of step 66 is also shown. On the other hand, RDL 54B is not connected to any overlying electrical connector, and is used for internal electrical redistribution for electrically connecting the features inside device 22. For example, the opposing ends of RDL 54B may be connected to two of metal lines 34A (FIG. 17). Alternatively stated, an entirety of RDL 54B is covered by passivation layer 56, and all sidewalls of RDL 54B may be in contact with passivation layer 56.

Figure 18:
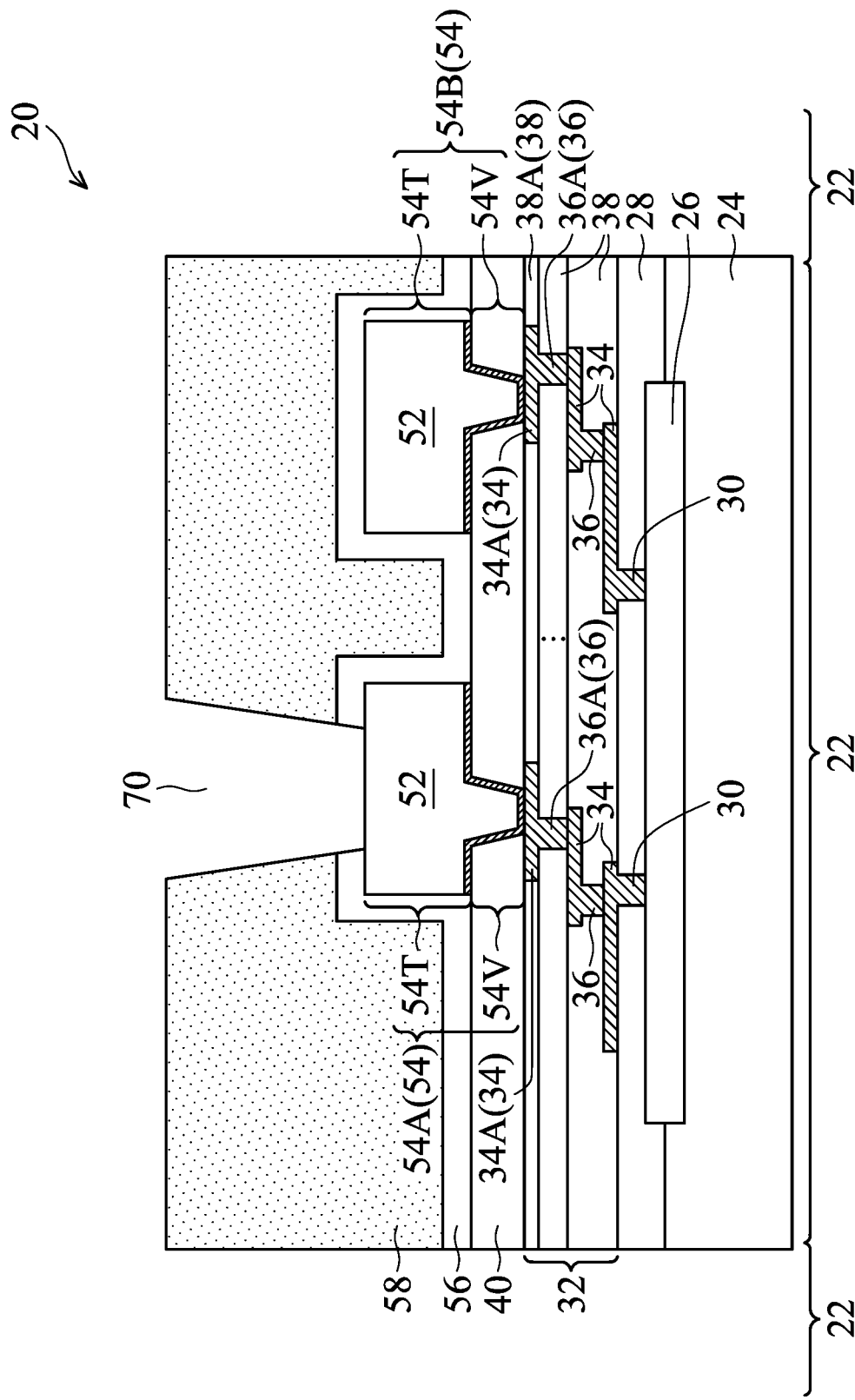
FIGS. 18 through 20 illustrate the cross-sectional views of intermediate stages in the formation of a package in accordance with some embodiments.
Figure 19:
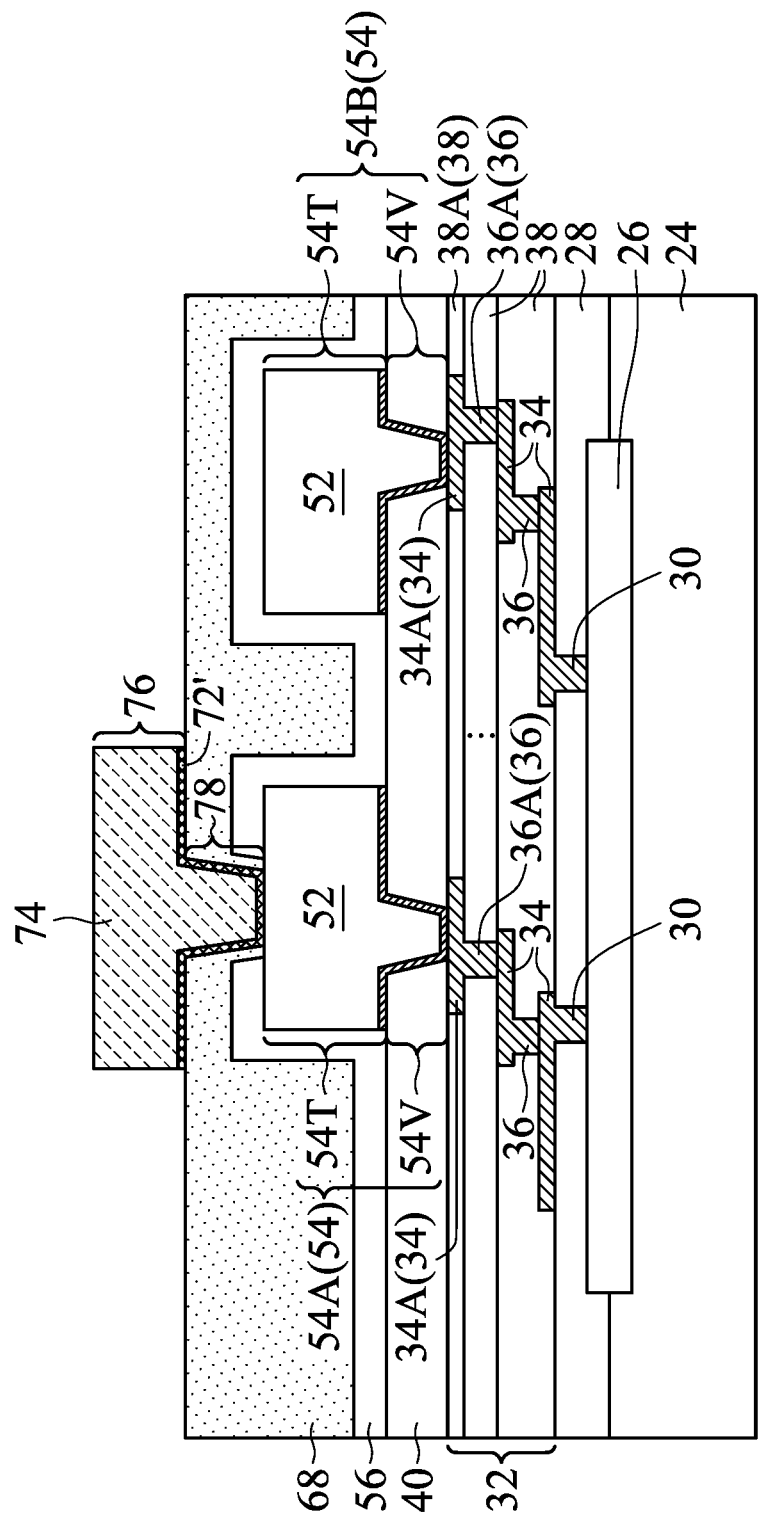

FIGS. 18 through 20 illustrate cross-sectional views of intermediate stages in the formation of a package in accordance with some embodiments of the present disclosure. Unless specified otherwise, the materials and the formation processes of the components in these embodiments are essentially the same as the like components, which are denoted by like reference numerals in the preceding embodiments shown in FIGS. 1 through 17. The details regarding the formation processes and the materials of the components shown in FIGS. 18 through 20 (and the embodiments as shown in FIGS. 21 and 22) may thus be found in the discussion of the preceding embodiments.

The initial processes of the embodiments shown in FIGS. 18 through 20 are essentially the same as shown in FIG. 1 through 9. Next, passivation layer 56 is etched using etching mask 58 to define the pattern. The resulting structure is shown in FIG. 18. In accordance with these embodiments, no step is formed in passivation layer 56. For example, the anisotropic etching process 64 as shown in FIG. 11 may be skipped, so that no step is formed. Next, etching mask 58 is removed, and the processes as shown in FIGS. 13 and 14 are performed to form and pattern planarization layer 68. The processes shown in FIGS. 15 and 16 are then performed to form electrical connector 76 and via 78. Subsequently, a singulation process is performed to separate devices 22 from each other, and a device 22 is shown in FIG. 19. Device 22 is then bonded to package component 80 to form package 86. The resulting package 86 is shown in FIG. 20.

Figure 21:
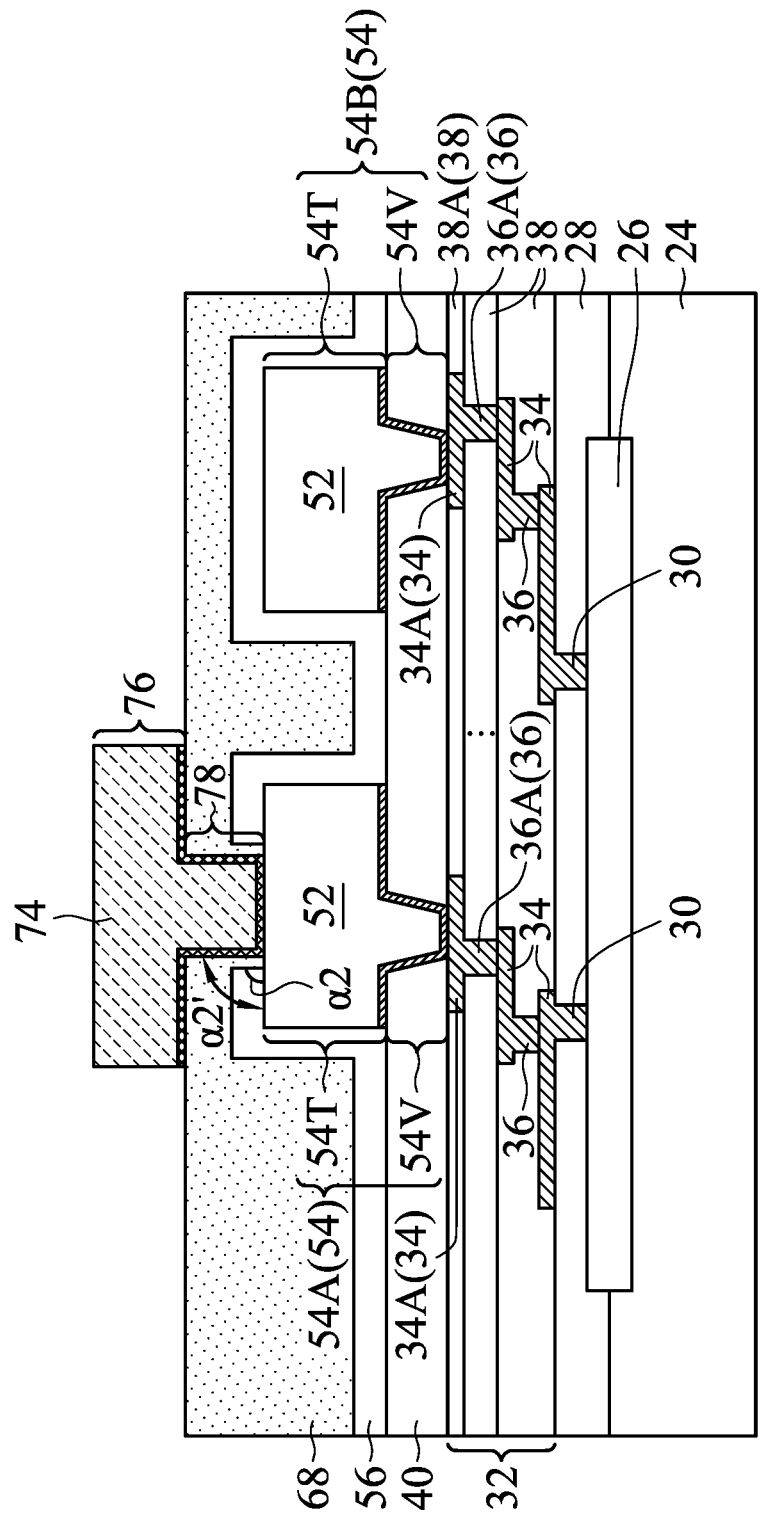
FIGS. 21 and 22 illustrate the cross-sectional views of intermediate stages in the formation of a package in accordance with some embodiments

FIGS. 21 and 22 illustrate some processes for forming a package in accordance with some embodiments. These embodiments are similar to the embodiments shown in FIGS. 18 through 20, except that the sidewalls of passivation layer 56 and planarization layer 68 are vertical, for example, with angles α2 and α2' being in the range between about 88 degrees and about 90 degrees. As a comparison, the angles α1 in the embodiments shown in FIGS. 17 and 20 may be smaller than about 80 degrees or smaller than about 75 degrees. In accordance with some embodiments, angles α1 may be in the range between about 60 degrees and about 80 degrees. The formation processes of the embodiments shown in FIGS. 21 and 22 are similar to the embodiments shown in FIGS. 18 through 20, except that in the etching of passivation layer 56 and planarization layer 68, the corresponding openings have more vertical sidewalls. The vertical sidewalls may be achieved, for example, by increasing the bias power in the etching process. The details may be found referring to the embodiments as discussed referring to FIGS. 1 through 17, and are not repeated herein.

The embodiments of the present disclosure have some advantageous features. The planarization layer in accordance with the embodiments of the present disclosure extends into the passivation layer and contacting the sidewalls of the passivation layer. Accordingly, a non-planar interface is formed between the planarization layer and the passivation layer to reduce delamination. The portion of the planarization layer extending into the passivation layer also acts as an anchor to prevent other portions of the planarization layer from being pulled away from the edges to cause delamination. Accordingly, the likelihood of having delamination between the planarization layer and the passivation layer is reduced.

In accordance with some embodiments of the present disclosure, a method comprises forming a patterned plating mask comprising a first opening; plating a conductive feature in the first opening; removing the patterned plating mask; depositing a passivation layer on a sidewall and a top surface of the conductive feature; patterning the passivation layer to form a second opening in the passivation layer, wherein the passivation layer comprises sidewalls facing the second opening; dispensing a planarization layer on the passivation layer; patterning the planarization layer to form a third opening, wherein after the planarization layer is patterned, a portion of the planarization layer is located in the second opening and covers the sidewalls of the passivation layer; and forming a UBM extending into the third opening. In an embodiment, the method further comprises forming a step in an edge portion of the passivation layer, wherein the step is directly underlying a top portion of the second opening, and wherein the step is lower than a top surface of the passivation layer. In an embodiment, the forming the step comprises forming an etching mask; and performing a plurality of etching processes using different process conditions. In an embodiment, the plurality of etching processes comprise an anisotropic etching process; and an isotropic etching process performed after the anisotropic etching process. In an embodiment, the forming the planarization layer comprises dispensing the planarization layer; and performing a planarization process on the planarization layer. In an embodiment, the forming the passivation layer comprises depositing an inorganic layer using a conformal deposition process. In an embodiment, the passivation layer is patterned using a first photo-sensitive material as an etching mask, and the planarization layer is further formed of a second photo-sensitive material.

In accordance with some embodiments of the present disclosure, a device comprises a first dielectric layer; a redistribution line comprising a metal seed layer; a first conductive feature over and contacting the metal seed layer; a passivation layer comprising sidewall portions extending on sidewalls of the metal seed layer and the first conductive feature; and a first top portion over and contacting the first conductive feature; a planarization layer comprising a second top portion over the first conductive feature, wherein the second top portion extends into the first top portion to contact the first conductive feature; and a second conductive feature extending into both of the first top portion and the second top portion to contact the redistribution line. In an embodiment, the planarization layer comprises a polymer, and the passivation layer comprises an inorganic dielectric material. In an embodiment, the second conductive feature comprises an under bump metallurgy, and the device further comprises a solder region over and contacting the second conductive feature. In an embodiment, the redistribution line comprises a via portion and a trace portion over and contacting the via portion. In an embodiment, the first conductive feature comprises copper, and is free from aluminum. In an embodiment, an edge portion of the passivation layer comprises a first top surface, and a second top surface lower than the first top surface to form a step. In an embodiment, a ratio of a height of the step to a thickness of the passivation layer is in a range between about ¼ and about ¾, and wherein the thickness is a vertical distance of the first top surface to the redistribution line. In an embodiment, the planarization layer contacts both of the first top surface and the second top surface of the edge portion of the passivation layer.

In accordance with some embodiments of the present disclosure, a device comprises a first passivation layer; a redistribution line comprising a via portion extending into the first passivation layer; and a trace portion over and contacting the via portion, wherein the trace portion is over the first passivation layer; a second passivation layer comprising a first top portion over and contacting the redistribution line, wherein the first top portion of the second passivation layer has a first opening, with sidewalls of the second passivation layer facing the first opening; a planarization layer comprising a polymer, wherein a portion of the planarization layer extends into the first opening to contact the sidewalls of the second passivation layer; a UBM extending into the planarization layer; and a solder region over and contacting the UBM. In an embodiment, the second passivation layer comprises a step. In an embodiment, the step is spaced apart from the UBM by the planarization layer. In an embodiment, the portion of the planarization layer has a slanted sidewall. In an embodiment, the portion of the planarization layer has a vertical sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a patterned mask comprising a first opening;
    forming a conductive feature in the first opening;
    removing the patterned mask;
    depositing a passivation layer on a sidewall and a top surface of the conductive feature;
    forming a step in an edge portion of the passivation layer, wherein the step comprises a top surface and two sidewalls of the passivation layer, wherein the forming the step comprises:
        forming an etching mask on the passivation layer;
        performing a first anisotropic etching process to etch-through the passivation layer using the etching mask for masking;
        after the first anisotropic etching process, performing an isotropic etching process on the etching mask; and
        after the isotropic etching process, performing a second anisotropic etching process on the passivation layer using the etching mask for masking the passivation layer;
    dispensing a planarization layer on the passivation layer that comprises the step;
    patterning the planarization layer to form a second opening, wherein after the planarization layer is patterned, a portion of the planarization layer is located in the passivation layer, and wherein the two sidewalls and the top surface are spaced apart from the second opening by the portion of the planarization layer; and
    forming an Under-Bump Metallurgy (UBM) extending into the second opening.

2. The method of claim 1, wherein at a time after the isotropic etching process and before the second anisotropic etching process, an extension portion of the passivation layer is directly underlying an additional opening in the etching mask, and wherein the step is formed in the extension portion.

3. The method of claim 1 further comprising, at a time before the patterning the planarization layer, performing a mechanical grinding process to level a top surface of the planarization layer.

4. The method of claim 1, wherein during the isotropic etching process on the etching mask, the passivation layer is not etched.

5. The method of claim 1, wherein the etching mask comprises a photoresist.

6. A method comprising:
    forming a redistribution line comprising:
        a metal seed layer; and
        a first conductive feature over and contacting the metal seed layer;

depositing a passivation layer comprising:
sidewall portions extending on sidewalls of the metal seed layer and the first conductive feature; and
a first top portion over and contacting the first conductive feature;
forming a step in the first top portion of the passivation layer, wherein the forming the step comprises:
forming an etching mask on the passivation layer;
etching-through the passivation layer using the etching mask for masking;
after the passivation layer is etched through, laterally recessing the etching mask; and
after the etching mask is laterally recessed, performing an anisotropic etching process on the passivation layer using the etching mask to form the step;
forming a planarization layer comprising a second top portion over the first conductive feature, wherein the second top portion extends into the first top portion to contact the first conductive feature, wherein the forming the planarization layer comprises performing a mechanical grinding process on the planarization layer; and
forming a second conductive feature extending into both of the first top portion and the second top portion to contact the redistribution line.

7. The method of claim 6, wherein the forming the second conductive feature comprises:
forming an under-bump metallurgy extending into the passivation layer to contact the first conductive feature:
forming a metal pillar on the under-bump metallurgy.

8. The method of claim 6, wherein the planarization layer is formed after the step is formed in the passivation layer, and wherein the planarization layer is a dielectric layer that contacts the step.

9. The method of claim 8, wherein when the etching mask is laterally recessed, the passivation layer is not etched.

10. The method of claim 9, wherein the planarization layer comprises a polymer layer.

11. The method of claim 9, wherein after the etching mask is laterally recessed, a top surface of an extension portion of the first top portion of the passivation layer is exposed through the etching mask, and the step is formed in the extension portion.

12. The method of claim 6, wherein the laterally recessing the etching mask and the anisotropic etching process are separate etching processes performed using different process conditions.

13. The method of claim 6, wherein the step comprises a higher top surface and a lower top surface of the passivation layer, and a first sidewall of the passivation layer, with the first sidewall being between, and joining, the higher top surface and the lower top surface, and wherein the passivation layer further comprises a second sidewall connecting the first sidewall to a top surface of the first conductive feature.

14. The method of claim 6, wherein the passivation layer comprises an inorganic dielectric material.

15. The method of claim 6, wherein the etching mask comprises a photoresist.

16. A method comprising:
forming a redistribution line comprising:
a via portion extending into a first passivation layer; and
a trace portion over and contacting the via portion, wherein the trace portion is over the first passivation layer;
forming a second passivation layer comprising a first top portion over and contacting the redistribution line;
etching the second passivation layer to form an opening;
forming a step in the second passivation layer, wherein the step is formed by processes comprising:
forming an etching mask on the second passivation layer;
performing a first anisotropic etching process to etch-through the second passivation layer using the etching mask for masking;
after the first anisotropic etching process, performing an isotropic etching process on the etching mask; and
after the isotropic etching process, performing a second anisotropic etching process on the second passivation layer using the etching mask for masking the second passivation layer;
forming a planarization layer comprising a polymer, wherein a portion of the planarization layer extends into the opening to contact sidewalls of the second passivation layer; and
forming an Under-Bump Metallurgy (UBM) extending into the planarization layer.

17. The method of claim 16, wherein the step overlaps the trace portion.

18. The method of claim 16, wherein the step is spaced apart from the UBM by a portion of the planarization layer.

19. The method of claim 16, wherein the portion of the planarization layer has a slanted sidewall.

20. The method of claim 16, wherein the portion of the planarization layer has a vertical sidewall.

* * * * *